(12) United States Patent
Tanaka

(10) Patent No.: US 9,069,254 B2
(45) Date of Patent: Jun. 30, 2015

(54) METHOD OF MANUFACTURING SEMICONDUCTOR DEVICE, AND MASK

(71) Applicant: Renesas Electronics Corporation, Kanagawa (JP)

(72) Inventor: Toshihiko Tanaka, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 47 days.

(21) Appl. No.: 13/897,657

(22) Filed: May 20, 2013

(65) Prior Publication Data

US 2013/0323928 A1 Dec. 5, 2013

(30) Foreign Application Priority Data

Jun. 5, 2012 (JP) .................................. 2012-127732

(51) Int. Cl.
| | | |
|---|---|---|
| G03F 7/26 | (2006.01) | |
| G03F 1/24 | (2012.01) | |
| H01L 21/308 | (2006.01) | |
| H01L 27/02 | (2006.01) | |
| H01L 27/118 | (2006.01) | |
| G03F 1/40 | (2012.01) | |
| G03F 1/48 | (2012.01) | |

(52) U.S. Cl.
CPC ................ G03F 1/24 (2013.01); H01L 21/308 (2013.01); H01L 27/0207 (2013.01); H01L 27/11807 (2013.01); G03F 1/40 (2013.01); G03F 1/48 (2013.01)

(58) Field of Classification Search
CPC ......... G03F 1/82; G03F 1/84; G03F 7/70866; G03F 7/70983; G03F 1/48; G03F 7/11; G03F 7/26; G03F 7/7075; G03F 7/70925; G03F 7/707; G03F 1/66; G03F 7/70741; G03F 1/62; G03F 7/70916; G03F 1/38; G02B 27/006; H01L 21/0274; H01L 21/308; H01L 21/027; H01L 21/67359; H01L 21/31144
USPC .................................... 430/322, 311, 5; 134/1
See application file for complete search history.

(56) References Cited

U.S. PATENT DOCUMENTS

| | | | |
|---|---|---|---|
| 5,397,665 A | 3/1995 | Tabuchi et al. | |
| 5,847,813 A * | 12/1998 | Hirayanagi | ..................... 355/75 |
| 2003/0064296 A1 * | 4/2003 | Yan | ..................... 430/5 |
| 2005/0003110 A1 * | 1/2005 | Tanaka et al. | ................. 428/1.23 |
| 2008/0233488 A1 * | 9/2008 | Chang | ................. 430/5 |
| 2010/0028813 A1 * | 2/2010 | Wu et al. | ....................... 430/322 |

FOREIGN PATENT DOCUMENTS

| | | |
|---|---|---|
| JP | H4-009950 | 1/1992 |
| JP | 2011-066258 | 3/2011 |

* cited by examiner

*Primary Examiner* — Caleen Sullivan
(74) *Attorney, Agent, or Firm* — Young & Thompson

(57) ABSTRACT

An improvement is achieved in the performance of a semiconductor device. A method of manufacturing the semiconductor device includes an exposure step of subjecting a resist film formed over a substrate to pattern exposure using EUV light reflected by the top surface of an EUV mask which is a reflection-type mask. In the exposure step, the EUV mask is held with the cleaned back surface thereof being in contact with a mask stage. In the EUV mask, the water repellency of the side surface thereof is higher than the water repellency of the top surface thereof. After the exposure step, the resist film subjected to the pattern exposure is developed to form a resist pattern.

17 Claims, 25 Drawing Sheets

METHOD OF MANUFACTURING SEMICONDUCTOR DEVICE, AND MASK

CROSS-REFERENCE TO RELATED APPLICATIONS

The disclosure of Japanese Patent Application No. 2012-127732 filed on Jun. 5, 2012 including the specification, drawings and abstract is incorporated herein by reference in its entirety.

BACKGROUND

The present invention relates to a method of manufacturing a semiconductor device which can be used appropriately for a method of manufacturing a semiconductor device including, e.g., a photolithographic step using a photomask.

In a manufacturing process of a semiconductor device such as a semiconductor integrated circuit device, a photolithographic step is repeatedly performed which irradiates a semiconductor substrate with exposure light via a photomask (hereinafter referred to also as "mask") having a circuit pattern defined therein to transfer the circuit pattern to a photoresist film formed over the semiconductor substrate.

In recent years, semiconductor devices have been increasingly scaled down so that a method for further shortening the wavelength of exposure light to enhance resolution has been studied. So far, ArF lithography has been developed which uses argon fluoride (ArF) excimer laser light having a wavelength of 193 nm. These days, however, development of EUV lithography using extreme ultraviolet light, i.e., EUV light having a wavelength of 13.5 nm far shorter than the wavelength of the ArF excimer laser light has been promoted.

In the EUV lithography, since the wavelength of the EUV light is extremely short, a transmission-type mask cannot be used, and a reflection-type mask using reflection by a multi-layer reflection film made of, e.g., Mo (molybdenum) and Si (silicon) or the like is used.

In addition, the EUV light is absorbed in atmospheric air and the optical intensity thereof significantly attenuates. Therefore, exposure is performed in a state in which the pressure in an exposure device has been reduced. Accordingly, when the EUV mask is held on a mask stage in the exposure device, the EUV mask cannot be held by vacuum suction. The EUV mask is held by electrostatic suction using an electrostatic chuck as the mask stage.

To such an EUV mask, foreign materials (particles) are likely to adhere when the EUV mask is held on a mask stage or when the EUV mask is removed from the mask stage and transported. To remove the adhering foreign materials, cleaning treatment may be performed. In addition, when the EUV mask subjected to the cleaning treatment is stored, measures for preventing contamination or foreign materials from adhering thereto may be taken.

In Japanese Unexamined Patent Publication No. 2011-66258 (Patent Document 1), a technique is described which holds the side surfaces of a mask substrate for an EUV mask or the like, brings a treatment liquid into contact with the surface of the mask substrate to be treated, and ejects gas toward the treatment liquid to separate the treatment liquid from the mask substrate.

In Japanese Unexamined Patent Publication No. Hei 4 (1992)-9950 (Patent Document 2), a technique is described which cleans and dries a photomask, exposes the photomask to a gas atmosphere of hexamethyldisilazane (HMDS) or the like for a given period, and stores the photomask to prevent contamination from developing thereon with time during the storage.

RELATED ART DOCUMENTS

Patent Documents

[Patent Document 1]
Japanese Unexamined Patent Publication No. 2011-66258
[Patent Document 2]
Japanese Unexamined Patent Publication No. Hei 4 (1992)-9950

SUMMARY

As a result of conducting study, the present inventors have made the following findings.

When an EUV mask is electrostatically sucked using an electrostatic chuck, a conductive film formed over the back surface of the EUV mask is held by electrostatic suction with the surface of the electrostatic chuck being in contact with the back surface of the EUV mask. The surface of the electrostatic chuck is made of ceramic, quartz, or the like. Therefore, when the operation of holding the EUV mask using the electrostatic chuck and the operation of removing the EUV mask from the electrostatic chuck and transporting the EUV mask are repeated, a chip occurs in the surface of the electrostatic chuck to result in foreign materials, which adhere to the back surface of the EUV mask.

With the foreign materials adhering to the back surface of the EUV mask and being interposed between the back surface of the EUV mask and the surface of the electrostatic chuck, the EUV mask is electrostatically sucked using the electrostatic chuck to be held on a mask stage. At this time, in the vicinity of the interposed foreign materials, the EUV mask is deformed to cause displacement of a pattern to be transferred by exposure to a resist film formed over a semiconductor substrate. This degrades the accuracy of the shape of the circuit pattern of a manufactured semiconductor device or the like and degrades the performance of the semiconductor device.

Other problems and novel features of the present invention will become apparent from a statement in the present specification and the accompanying drawings.

According to an embodiment, a method of manufacturing a semiconductor device includes an exposure step of subjecting a resist film formed over a substrate to pattern exposure using EUV light reflected by a top surface of a reflection-type mask. In the exposure step, the reflection-type mask has a cleaned back surface and is held with the cleaned back surface thereof being in contact with a mask stage. In the reflection-type mask, a water repellency of a side surface thereof is higher than a water repellency of the top surface thereof. After the exposure step, the resist film subjected to the pattern exposure is developed to form a resist pattern.

According to another embodiment, the mask is a reflection-type mask for performing pattern exposure using EVU light reflected by the top surface thereof. In the mask, a water repellency of a side surface thereof is higher than a water repellency of the top surface thereof.

According to the embodiment, the performance of the semiconductor device can be improved.

DETAILED DESCRIPTION

Figure 1:
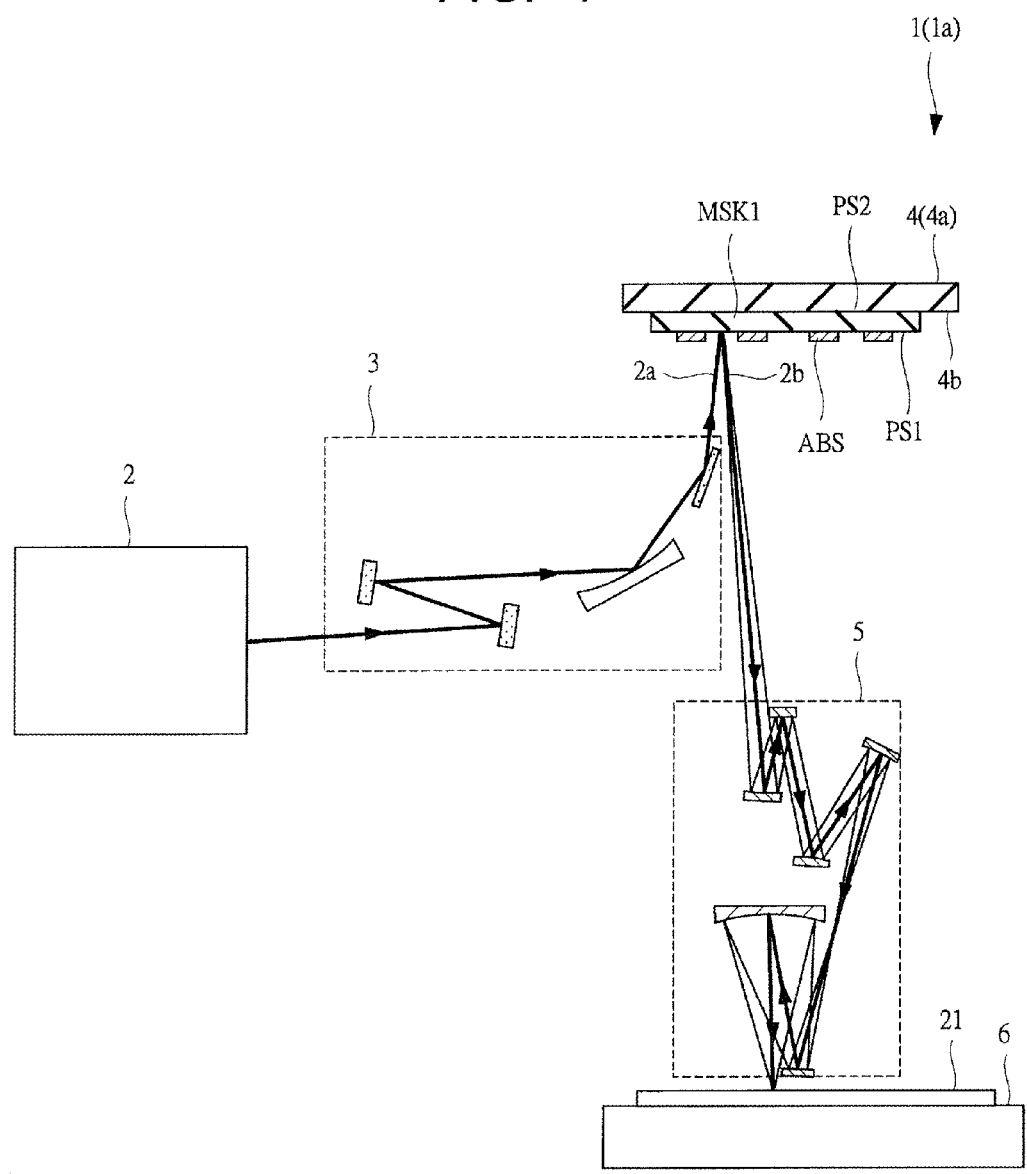
FIG. 1 is a view schematically showing a configuration of an exposure device of Embodiment 1.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, details, supplementary explanation, and so forth of part or the whole of the others.

Also in the following embodiments, when the number and the like (including the number, numerical value, amount, range, and the like) of elements are referred to in the following embodiments, they are not limited to specific numbers unless particularly explicitly described otherwise or unless they are obviously limited to specific numbers in principle. The number and the like of the elements may be not less than or not more than specific numbers.

Also in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

Hereinbelow, representative embodiments will be described in detail with reference to the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

First Embodiment

Referring to the drawings, a description will be given of a manufacturing process of a semiconductor device as an embodiment. The manufacturing process of the semiconductor device of Embodiment 1 includes an exposure step of subjecting a resist film formed over the main surface of a semiconductor substrate (hereinafter referred to also as "wafer") to pattern exposure using EUV light as exposure light.

<Exposure Device>

First, a description will be given of an exposure device for performing the exposure step included in the manufacturing process of the semiconductor device of Embodiment 1. The exposure device is for performing pattern exposure of the resist film formed over the main surface of the semiconductor substrate using the EUV light as the exposure light.

FIG. 1 is a view schematically showing a configuration of the exposure device of Embodiment 1.

As shown in FIG. 1, an exposure device 1 has an exposure mechanism unit 1a. The exposure mechanism unit 1a is provided with an EUV light source 2. Exposure light 2a which is EUV light having a center wavelength of 13.5 nm and emitted from an EUV light source 2 is incident on (irradiates) a pattern surface (top surface or first main surface) PS1 of an EUV mask MSK1 held in the exposure mechanism unit 1 via a reflection-type illumination optical system 3 including a multilayer film refection mirror. The EUV mask MSK1 has the pattern surface (top surface or first main surface) PS1 formed with an exposure pattern, and a back surface (second main surface) PS2 opposite to the pattern surface (top surface or first main surface) PS1.

The EUV mask MSK1 is held on a mask stage (holder) 4. Specifically, the EUV mask MSK1 is held on the mask stage (holder) 4 through electrostatic suction of the back surface (second main surface) PS2 thereof being in contact with a lower surface (surface) 4b of an electrostatic chuck 4a provided over the mask stage (holder) 4.

The EUV light having an extremely short wavelength is accordingly absorbed by the mask substrate and cannot be transmitted thereby. Therefore, as an EUV mask, a transmission-type mask which transmits the exposure light cannot be used. Consequently, as the EUV mask MSK1, the exposure pattern including a multilayer reflection film (the illustration thereof is omitted) and absorber patterns ABS over the pattern surface (top surface or first main surface) PS1 is formed, and the reflection-type mask which reflects the EUV light as the exposure light is used. The detailed structure of the EUV mask MSK1 will be described using FIG. 3 described later.

The exposure light 2a incident on (irradiating) the pattern surface (top surface or first main surface) PS1 is reflected by the pattern surface (top surface or first main surface) PS1. Reflected light 2b resulting from the reflection by the pattern surface (top surface or first main surface) PS1 is transmitted by a reduction projection optical system 5 including the multilayer film reflection mirror and reduction-projected on a wafer 21 held in the exposure mechanism unit 1a to perform pattern exposure of the resist film (the illustration thereof is omitted) formed over the wafer 21. That is, onto the wafer 21, the exposure pattern formed over the pattern surface (top surface or first main surface) PS1 of the EUV mask MSK1 is transferred (pattern transfer). The wafer 21 is held by a wafer stage 6 provided movable. By repeating the movement of the wafer stage 6 and the pattern transfer, a large number of patterns are transferred to the desired regions of the wafer 21.

<EUV Mask>

Figure 2:
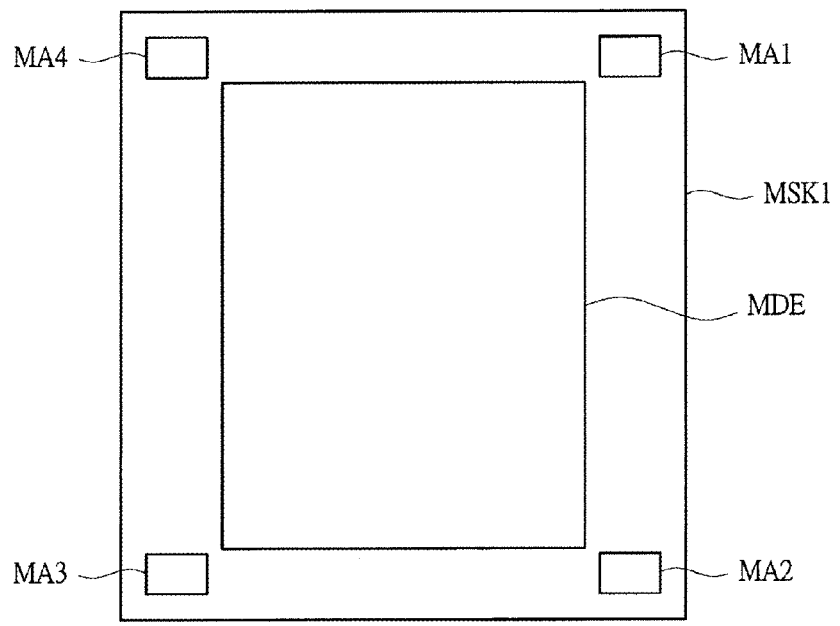
FIG. 2 is a plan view schematically showing the top surface of an EUV mask of Embodiment 1.
Figure 3:
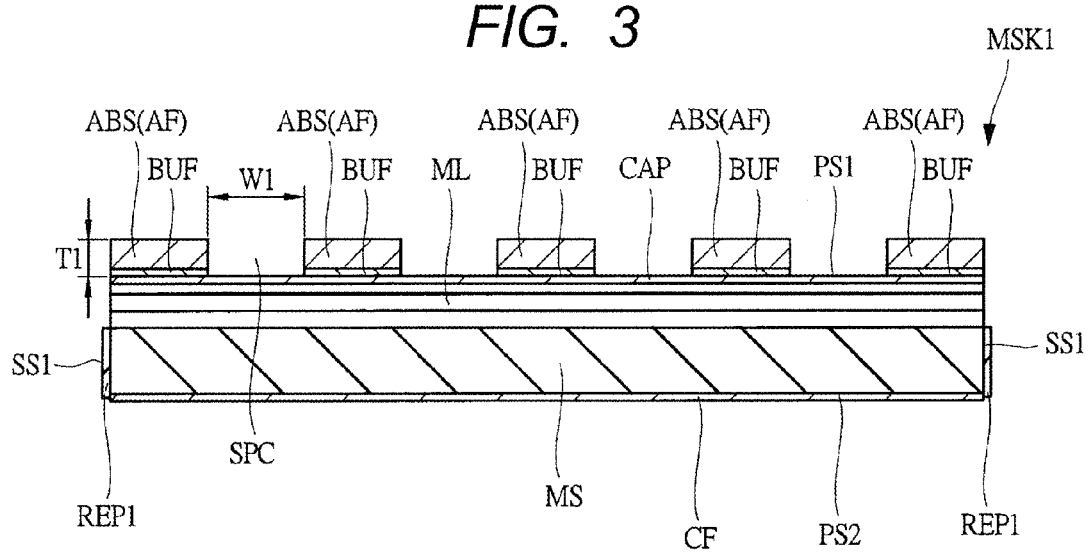
FIG. 3 is a main-portion cross-sectional view showing a part of the EUV mask of Embodiment 1.
Figure 4:
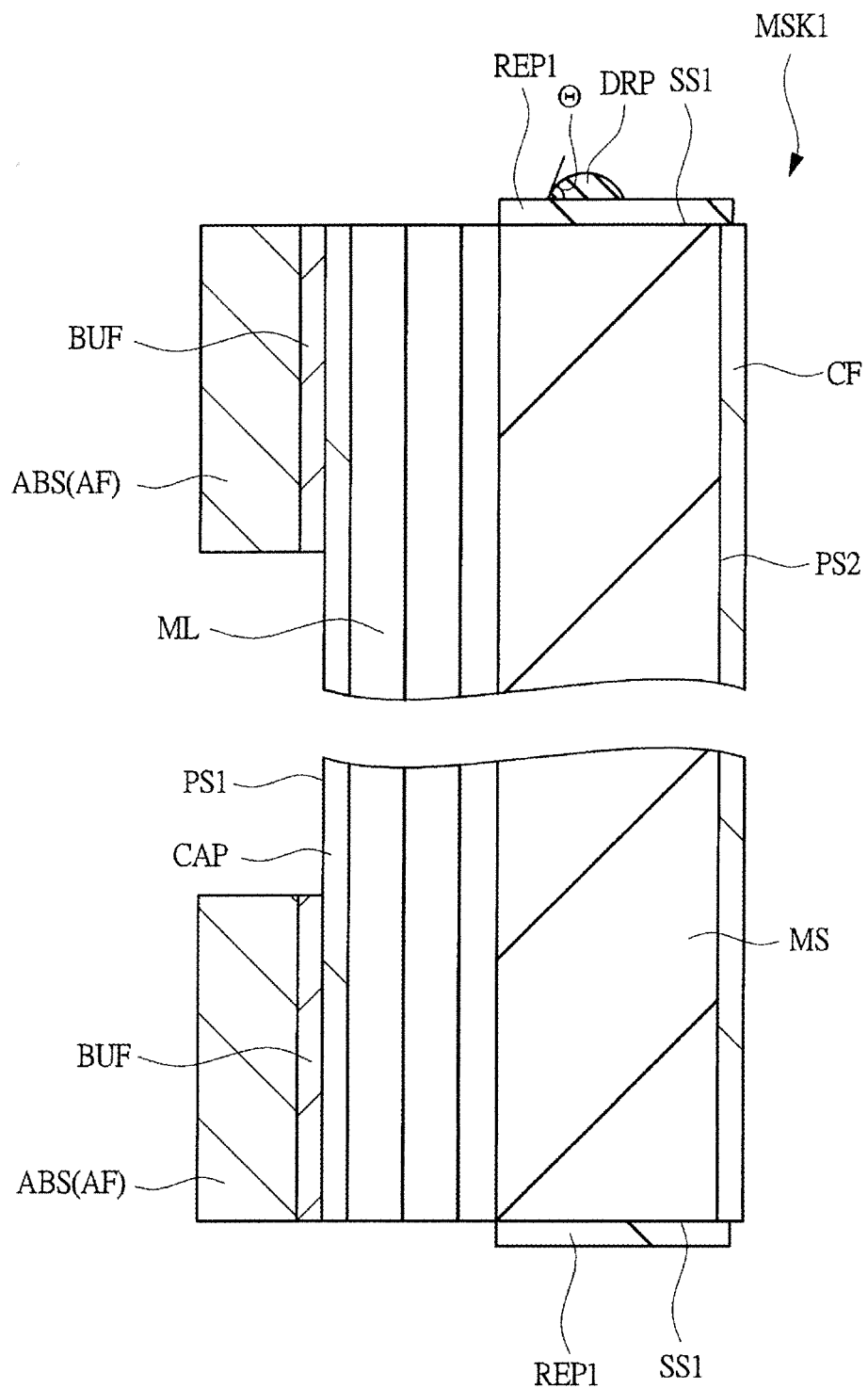
FIG. 4 is a view for illustrating a method of measuring an angle of contact as well as the angle of contact.

Next, the schematic illustration and configuration of the EUV mask in Embodiment 1 will be described with reference to FIGS. 2 to 4. FIG. 2 is a plan view schematically showing the top surface of the EUV mask of Embodiment 1. FIG. 3 is a main-portion cross-sectional view showing a part of the EUV mask of Embodiment 1. FIG. 4 is a view for illustrating a method of measuring an angle of contact as well as the angle of contact.

As described above, in the wavelength region (e.g., 13.5 nm) of the EUV light, the transmission-type mask which transmits the exposure light cannot be used as the EUV mask. Accordingly, as the EUV mask MSK1, as shown in FIG. 3, a multilayer reflection film (reflection film) ML is formed over the pattern surface (top surface or first main surface) PS1, the absorber patterns ABS are formed over the multilayer reflection film (reflection film) ML, and the reflection-type mask which reflects the EUV light as the exposure light is used.

As shown in FIG. 2, the EUV mask MSK1 has a device pattern area MDE where the circuit pattern of the semiconductor integrated circuit device is defined at the center portion thereof. In the peripheral portion of the EUV mask MSK1, alignment mark areas MA1, MA2, MA3, and MA4 including marks for aligning the EUV mask, wafer alignment marks, and the like are disposed.

As shown in FIG. 3, the EUV mask MSK1 has the pattern surface (top surface or first main surface) PS1, the back surface (second main surface) PS2 opposite to the pattern surface (top surface or first main surface) PS1, and side surfaces SS1 disposed between the pattern surface (top surface or first main surface) PS1 and the back surface (second main surface) PS2.

The EUV mask MSK1 has a mask base (mask substrate) MS made of, e.g., quartz glass, low thermal expansion glass, or another low thermal expansion material (LTEM). On the pattern surface (top surface or first main surface) PS1 side of the EUV mask MSK1 side, over the mask base (mask substrate) MS, the multilayer reflection film (reflection film) ML is formed. The multiplayer reflection film (reflection film) ML has a structure in which, e.g., molybdenum (Mo) and silicon (Si) are alternately stacked in layers to reflect the EUV light as the exposure light. As the multiplayer reflection film (reflection film) ML, a multilayer film including 40 pairs of the Mo layers and the Si layers is normally used, but a multilayer film including 50 or 60 pairs of the Mo layers and the Si layers may also be used. Note that the state in which the multilayer reflection film (reflection film) ML is formed over the mask base (mask substrate) MS is referred to as a multilayer-film mask blank.

The EUV mask MSK1 has the absorber patterns ABS formed over the multilayer reflection film (reflection film) ML (i.e., over the multilayer-film mask blank). The absorber patterns ABS are each formed of an absorber film AF which absorbs the EUV light as the exposure light and is disposed so as to have a desired pattern. Accordingly, the exposure pattern formed over the pattern surface (top surface or first main surface) PS1 of the EUV mask MSK1 includes the multilayer reflection film (reflection film) ML formed over the pattern surface (top surface or first main surface) PS1 and the absorber patterns ABS formed over the multilayer reflection film (reflection film) ML. Examples of the material of the absorber patterns ABS which can be used include a material having a low reflectivity with respect to the EUV light, such as tantalum (Ta), tantalum boronitride (TaBN), or tantalum nitride (TaN).

In the EUV mask MSK1, over the multilayer reflection film (reflection film) ML, a capping layer CAP is formed. Examples of the material of the capping layer CAP which can be used include Si, ruthenium (Ru), and chromium (Cr).

Over the capping layer CAP, the absorber patterns ABS described above are formed via buffer layers BUF. The buffer layers BUF are each formed of a protective film which prevents the multilayer reflection film (reflection film) ML from being impaired (damaged) when processing using a correction technique using a focused ion beam (FIB) is performed or prevents foreign materials (particles) from adhering to and contaminating the multilayer reflection film (reflection film) ML. However, as shown in FIG. 3, from the regions of the pattern surface (top surface or first main surface) PS1 from which the absorber patterns ABS have been removed, after the processing using the FIB, the buffer layers BUF are eventually removed. As the material of the buffer layers BUF, Cr, chromium nitride (CrN), or the like is used. When a correction technique using an electron beam (EB) or the like is used instead of the correction technique using the FIB, the buffer layer BUF can also be omitted.

The upper surfaces of the absorber patterns ABS have been subjected to oxidation treatment (the illustration thereof is omitted). This suppresses the reflectivity with respect to defect inspection light having a wavelength in the vicinity of, e.g., 250 nm or 193 nm and allows a pattern defect inspection to be performed with high sensitivity.

On the other hand, under the back surface (second main surface) PS2 of the EUV mask MSK1, i.e., under the back surface (second main surface) PS2 of the mask base (mask substrate) MS, a conductive film CF is formed. The EUV mask MSK1 is held on the mask stage (holder) 4 through electrostatic suction of the conductive film CF by the electrostatic chuck 4a (see FIG. 1) of the mask stage (holder) 4 (see FIG. 1).

In Embodiment 1, each of the side surfaces SS1 of the EUV mask MSK1 has water repellency (a hydrophobic property) and repels a cleaning liquid (rinse liquid) made of, e.g., water (pure water) in a mask-back-surface cleaning step (see FIG. 8 described later) for the EUV mask MSK1.

In the EUV mask MSK1 shown in FIG. 3, each of the side surfaces SS1 of the mask base (mask substrate) MS is formed with a lateral surface portion (side surface portion) REP1 having water repellency. On the other hand, under the back surface (second main surface) PS2 of the EUV mask MSK1, the conductive film CF is formed so that the back surface PS2 does not have water repellency (a hydrophobic property). Accordingly, the water repellency of the lateral surface portions (side surface portions) RP1 of the EUV mask MSK1 is higher than the water repellency of the back surface (second main surface) PS2 of the EUV mask MSK1. With such a structure, it is possible to prevent or inhibit the cleaning liquid (rinse liquid) supplied to the back surface (second main surface) PS2 in the mask-back-surface cleaning step (see FIG. 8 described later) for the EUV mask MSK1 from reaching the side surface SS1.

Water repellency is defined by the angle of contact with the cleaning liquid (rinse liquid) made of, e.g., water (pure water) or the like. As shown in FIG. 4, the angle of contact or contact angle is determined by disposing the EUV mask MSK1 such that each of the side surfaces SS1 of the EUV mask MSK1 is horizontal, dropwise supplying the cleaning liquid (rinse liquid) to the side surface SS1 using a microsyringe or the like to form a liquid drop DRP, and measuring the contact angle of the liquid drop DRP at the side surface SS1. When the volume of the liquid drop DRP is excessively large, the liquid drop DRP is deformed by its own weight. Accordingly, the volume of the liquid drop DRP preferably has a value which is not less than a lower limit value which allows the angle to be precisely measured and is minimum. The range of the volume of the liquid drop DRP in which the liquid drop DRP is not deformed by its own weight is, e.g., not more than 50 µL. An angle $\Theta$ can be measured using, e.g., a protractor including a magnifying mirror, but a method of measuring the angle $\Theta$ is not limited to the method described above. Various other methods can be used therefor.

As described above, as the liquid drop DRP, a liquid drop made of, e.g., water (pure water) is used. However, instead of the liquid drop made of water (pure water), a liquid drop made of any of various cleaning liquids, ozone water, or the like can also be used. However, the interfacial energy of any of various cleaning liquids or ozone water other than water (pure water) is different from the interfacial energy of water (pure water). Accordingly, the contact angle measured using the liquid drop made of any of various cleaning liquids or ozone water other than water (pure water) is preferably corrected by comparatively converting the interfacial energy of any of various cleaning liquids or ozone water to the interfacial energy of water (pure water).

In Embodiment 1, the water repellency of the side surface SS1 of the EUV mask MSK1 is preferably higher than the water repellency of the pattern surface (top surface or first main surface) PS1 of the EUV mask MSK1.

To the pattern surface (top surface or first main surface) PS1 of the EUV mask MSK1, a pellicle for preventing foreign materials from adhering to the pattern surface (top surface or first main surface) PS1 has not been stuck. Consequently, the EUV MSK1 may be used as a so-called pellicle-less mask (pellicle-less operation). In such pellicle-less operation, to remove the foreign materials (particles) adhering to the pattern surface (top surface or first main surface) PS1, wet cleaning using a cleaning liquid (rinse liquid) needs to be performed. When exposure is performed using the EUV light as exposure light, contamination (so-called exposure contamination) resulting from adhesion of carbon occurs so that a cleaning step is performed as necessary. As the cleaning step, wet cleaning using a cleaning liquid (rinse liquid) may be performed.

When the water repellency of the pattern surface (first main surface) PS1 is equal to or higher than the water repellency of the side surface SS1, in the wet cleaning described above, the cleaning liquid (rinse liquid) made of, e.g., water (pure water) or the like does not easily enter the gaps between the individual absorber patterns ABS.

The pitch of the patterns formed using EUV lithography is such that, e.g., the half pitch thereof (hp) is not more than 22 nm. Consequently, over a mask (4× mask) having a demagnification factor of, e.g., 4, a width W1 of a space portion (opening) SPC which is the portion between the absorber patterns ABS is not more than 88 nm and the thickness of each of the absorber patterns ABS is not less than 50 nm. When the total of the respective thicknesses of each of the absorber patterns ABS and the corresponding buffer layer BUF is defined as a height T1 of the space portion (opening) SPC, the height T1 of the space portion (opening) SPC may be larger than 88 nm which is the width W1 of the space portion (opening) SPC. That is, an aspect ratio which is the ratio of the height T1 of the space portion (opening) SPC to the width W1 thereof may be larger than 1. In such a case, the cleaning liquid (rinse liquid) is less likely to enter the gaps between the individual absorber patterns ABS to degrade the cleaning ability of the wet cleaning, resulting in the problem that, even when the wet cleaning is performed, the foreign materials (particles) adhering to the pattern surface (top surface or first main surface) PS1 are not removed (so-called leftover or residue).

However, in Embodiment 1, the water repellency of the side surface SS1 of the EUV mask MSK1 is higher than the water repellency of the pattern surface (top surface or first main surface) PS1 of the EUV mask MSK1. In other words, the water repellency at the bottom surface and side walls of the space portion (opening) SPC is lower than the water repellency at the side surface SS1. Accordingly, even when the aspect ratio which is the ratio of the height T1 of the space portion (opening) SPC to the width W1 thereof is high, the cleaning liquid (rinse liquid) can easily enter the space portion (opening) SPC. Therefore, it is possible to prevent the cleaning liquid (rinse liquid) from reaching the pattern surface (top surface or first main surface) PS1 when the back surface (second main surface) PS2 is cleaned and also prevent or inhibit the cleaning ability to clean the pattern surface (top surface or first main surface) PS1 from deteriorating when the cleaning step of cleaning the pattern surface (top surface or first main surface) is performed.

As a method of manufacturing the foregoing EUV mask MSK1 of which the lateral surface portion (side surface portion) REP1 has water repellency, a method as shown below can be used. For example, after the mask base (mask substrate) MS is used and before the multilayer reflection film (reflection film) ML is formed, fluorine end treatment, i.e., fluorination treatment such as fluorine substitution treatment for the end groups of the molecules forming the mask base (mask substrate) MS is performed. Specifically, using perfluoroalkyl-group-containing silane having a —$CF_3$ group as a silane coupling agent, the fluorination treatment is performed. As a result, when the mask base (mask substrate) MS is made of, e.g., quartz glass, the fluorine end treatment is performed in which a silanol group from a side surface of the mask base (mask substrate) MS and the perfluoroalkyl-group-containing silane serving as the silane coupling agent form a siloxane bond to result in the perfluoroalkyl group having $CF_3$.

When such fluorine end treatment is performed, it is preferable to perform heat treatment at a temperature of about 200° C. and accelerate a reaction which forms the siloxane bond. It is also preferable to use, as the perfluoroalkyl group of the perfluoroalkyl-group-containing silane, a perfluoroalkyl group having a highly reactive end group such as an isocyanate group or a chlorine group.

It is also preferable to subject the side surfaces of the mask base (mask substrate) MS to so-called roughening treatment in advance such that the side surfaces have undulations at depths of about several nanometers to several hundreds of nanometers. This further enhances the water repellency of the lateral surface portion (side surface portion) REP1, allows the silanol group to be easily bonded to the perfluoroalkyl group having an end group containing fluorine at the side surfaces of the mask base (mask substrate) MS, and improves the durability of the lateral surface portion (side surface portion) EP1. It is also possible to use, as a silane coupling agent which can provide water repellency practically sufficient but lower than that of the silane coupling agent having the end group containing fluorine, a silica-based silane coupling agent such as, e.g., polydimethyl silicone or polydimethyl silicone having the trialkoxy-group-substituted end.

For the EUV mask MSK1, it is also possible to stick a fluorine resin or water-repellent films to the side surfaces thereof or coat the side surfaces thereof with a fluorine resin or water-repellent films and thereby form the lateral surface portions (side surface portions) REP1. A fluorine resin is a material which is inherently unlikely to be stuck. However, by using a polydopamine solution or the like as an adhesion enhancer, it is possible to easily stick the fluorine resin to the mask base (mask substrate) MS. At this time also, it is preferable to subject the side surfaces of the mask base (mask substrate) MS to roughening treatment such that the side surfaces have undulations at depths of about several nanometers to several hundreds of nanometers. This enhances the adhesive force of the fluorine resin or water-repellent films to the side surfaces of the mask base (mask substrate) MS and also further enhances the water repellency of the lateral surface portion (side surface portion) REP1. It is also possible to mechanically attach plates made of the fluorine resin to the side surfaces of the mask base (mask substrate) MS by a method such as screwing or hooking.

As for water repellent treatment for providing the side surfaces with water repellency by the fluorination treatment described above or the like, it can be performed after the mask base (mask substrate) MS is provided and before the multi-layer reflection film (reflection film) ML is formed. Alternatively, the water repellent treatment can also be performed after the absorber film AF is deposited over the mask base (mask substrate) MS and before the absorber film AF is subjected to patterning. When the water repellent treatment is performed before the multilayer reflection film (reflection film) ML is formed over the mask base (mask substrate) MS, the mask base (mask substrate) MS can be easily handled in the steps subsequent thereto since the water repellent treatment has already ended. When the water repellent treatment described above is performed after the absorber film AF is subjected to patterning to form the absorber patterns ABS, prior to the water repellent treatment, an etching step using a plasma and a cleaning step using a solvent in which an organic compound can be easily dissolved have ended. Therefore, it is possible to prevent or inhibit the water repellency of the lateral surface portions (side surface portions) REP1 subjected to the water repellent treatment from being degraded by the etching step or the cleaning step.

<Modification of EUV Mask>

Figure 5:
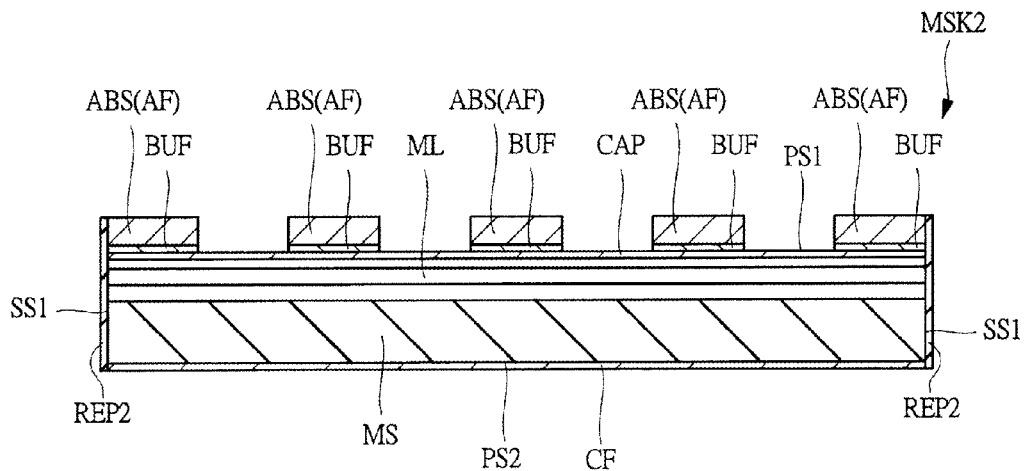
FIG. 5 is a main-portion cross-sectional view showing a part of a modification of the EUV mask of Embodiment 1.
Figure 6:
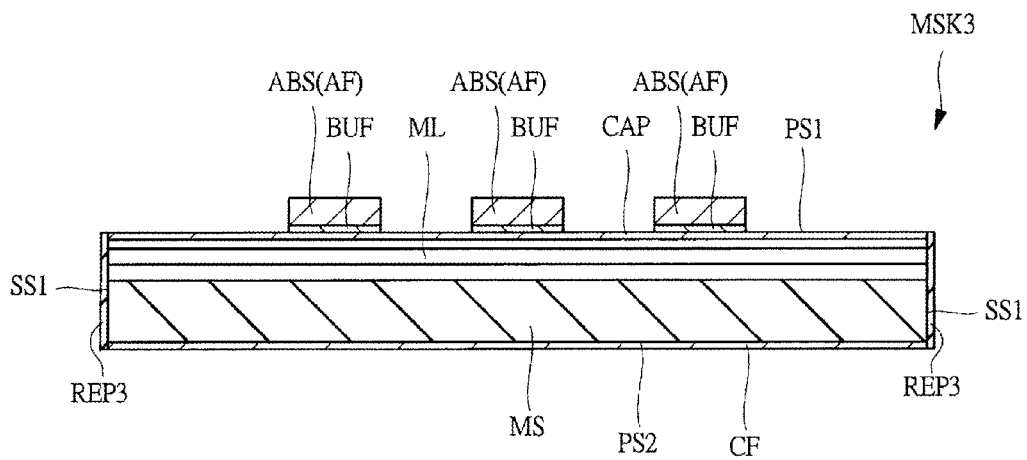
FIG. 6 is a main-portion cross-sectional view showing a part of another modification of the EUV mask of Embodiment 1.
Figure 7:
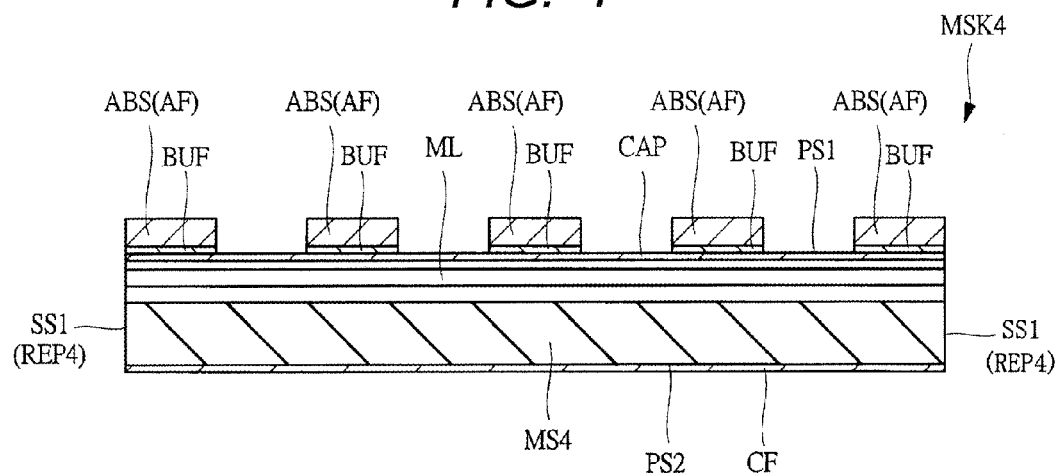
FIG. 7 is a main-portion cross-sectional view showing a part of still another modification of the EUV mask of Embodiment 1.

FIGS. 5 to 7 are main-portion cross-sectional views showing parts of modifications of the EUV mask of Embodiment 1. FIG. 5 shows the modification in which the side surfaces SS1 including the side surfaces of the mask base (mask substrate) MS and the side surfaces of the absorber patterns ABS (absorber film AF) have been subjected to water repellent treatment. FIG. 6 shows the modification in which the side surfaces SS1 including the side surfaces of the mask base (mask substrate) MS and the side surfaces of the capping layer CAP have been subjected to water repellent treatment, but the side surfaces of the absorber patterns ABS (absorber film AF) have not been subjected to the water repellent treatment. FIG. 7 shows the modification in which the material of the mask base (mask substrate) MS4 has inherent water repellency. Note that the members of the EUV masks of FIGS. 5 to 7 which have the same functions as the members of the EUV mask of FIG. 3 are designated by the same reference numerals, and a repeated description thereof is omitted.

The cross-sectional view of FIG. 5 shows a cross-sectional structure of an EUV mask MSK2 as a modification of the EUV mask. In FIG. 5, the side surfaces SS1 of the entire EUV mask MSK2 including the side surfaces of the mask base (mask substrate) MS, the side surfaces of the multilayer reflection film (reflection film) ML, the side surfaces of the capping layer CAP, the side surfaces of the buffer layers BUF, and the side surfaces of the absorber patterns ABS each made of the absorber film AF have been subjected to the water repellent treatment.

The EUV mask MSK2 described above can be produced by subjecting the side surfaces SS1 to the water repellent treatment and forming the side surfaces SS1 with lateral surface portions (side surface portions) REP2 after the production of a mask blank formed with the absorber film AF and before the formation of the absorber patterns ABS. When the side surfaces SS1 are subjected to the water repellent treatment after the formation of the absorber film AF and before the formation of the absorber patterns ABS, the EUV mask MSK2 can be easily handled in the steps subsequent to the step of forming the absorber patterns ABS since the water repellent treatment of the side surfaces SS1 has already ended. Subsequently, the absorber film AF is formed and subjected to a blank quality inspection, and then the water repellent treatment of the side surfaces SS1 is performed. As a result, it is possible to improve productivity without performing the water repellent treatment of the side surfaces SS1 for defective blank products.

Alternatively, the EUV mask MSK2 can also be produced by forming the absorber patterns ABS, then perform the water repellent treatment of the side surfaces SS1, and form the side surfaces SS1 with the lateral surface portions (side surface portions) REP. When the water repellent treatment of the side surfaces SS1 is performed after the absorber film AF is subjected to patterning to form the absorber patterns ABS, prior to the water repellent treatment, an etching step using a plasma and a cleaning step using a solvent in which an organic compound can be easily dissolved has ended. Therefore, it is possible to prevent or inhibit the water repellency of the lateral surface portions (side surface portions) REP2 formed through the water repellent treatment of the side surfaces SS1 from being degraded by the etching step or the cleaning step.

For the EVU mask MSK2 also, in the same manner as for the EUV mask MSK1 (see FIG. 3), it is possible to form the lateral surface portions (side surface portions) REP2 by fluorination treatment or by sticking a fluorine resin or water-repellent films to the side surfaces or coating the side surfaces with a fluorine resin or water-repellent films. In the fluorination treatment of the EUV mask MSK2, fluorination treatment is performed on mutually different materials such as the mask base (mask substrate) MS, the multilayer reflection film (reflection film) ML, the capping layer CAP, the buffer layers BUF, and the absorber patterns ABS (absorber film AF). Consequently, the water repellencies of the individual layers may be different from each other. However, in such a case, it is sufficient if the side surfaces of the mask base (mask substrate) MS which are the thickest portions of the individual portions forming the EUV mask MSK2 or the side surfaces of the multilayer reflection film (reflection film) ML which are the thickest portions next to the mask base (mask substrate) MS has sufficient water repellency.

The cross-sectional view of FIG. 6 shows a cross-sectional structure of an EUV mask MSK3 as another modification of the EUV mask. In FIG. 6, the side surfaces SS1 of the EUV mask MSK3 including the side surfaces of the mask base (mask substrate) MS, the side surfaces of the multilayer reflection film (reflection film) ML, and the side surfaces of the capping layer CAP have been subjected to the water repellent treatment.

For example, the EUV mask MSK3 is a bright field mask, and the absorber patterns ABS are not formed outside the field portion thereof or in the peripheral portion thereof outside the device pattern area MDE (see FIG. 3). The outermost layer of the EUV mask MSK3 is the capping layer CAP formed over the surface of the multilayer reflection film (reflection film) ML. In such a case, the side surfaces of the mask base (mask substrate) MS, the side surfaces of the multilayer reflection film (reflection film) ML, and the side surfaces of the capping layer CAP are subjected to water repellent treatment.

For the EVU mask MSK3 also, in the same manner as for the EUV mask MSK2 (see FIG. 5), after the production of a mask blank formed with the absorber film AF and before the formation of the absorber pattern ABS, the water repellent treatment of the side surfaces SS1 is performed to form the side surfaces SS1 with lateral surface portions (side surface portion) REP3. As a result, the EUV mask MSK3 can be easily handled in the steps subsequent to the step of forming the absorber patterns ABS since the water repellent treatment of the side surfaces SS1 has already ended. In addition, the water repellent treatment of the side surfaces SS1 is not performed for the defective blank products, and productivity can be improved.

The cross-sectional view of FIG. 7 shows a cross-sectional structure of an EUV mask MSK4 as still another modification of the EUV mask. In an EUV mask MSK4 shown in FIG. 7, as the mask base (mask substrate), a mask base (mask substrate) MS4 having inherent water repellency is used.

As the material of the foregoing mask base (mask substrate) MS4 having inherent water repellency, a material to which water repellency has been given by adding carbon, fluorine, or the like or molecularly binding carbon, fluorine, or the like is used. Since the mask base (mask substrate) MS4 has inherent water repellency, the side surfaces SS1 of the mask base (mask substrate) MS4 serve as lateral surface portions (side surface portions) REP4 having water repellency. Note that the material of the mask base (mask substrate) MS4 preferably has a low thermal expansion coefficient even when water repellency has been given thereto in the same manner as when water repellency has not been given thereto.

For the EUV mask MSK4, it is sufficient to merely change the material of the mask base (mask substrate). Accordingly, the number of extra steps added to the production process of the mask blank and the production process of the EUV mask is small and the existing steps and equipment can be used extensively without alterations.

So far, the modifications of the EUV mask have been described using FIGS. 5 to 7. As long as the side surfaces have water repellency, as the EUV mask, any of EUV masks having various structures other than the structures of the EUV masks in the modifications described using FIGS. 5 to 7 can be used. Also, as a method of performing the water repellent treatment of the side surfaces, any of various methods other than the methods described in the modifications using FIGS. 5 to 7 can be performed.

Note that the portions of the EUV mask having water repellency are not limited to the side surfaces SS1. It may also be possible that the portion of the back surface (second main surface) PS2 or the pattern surface (top surface or first main surface) PS1 which is located in the vicinity of the side surface SS1, i.e., a peripheral portion has water repellency. It may also be possible that the entire side surfaces of the mask base (mask substrate) MS do not have water repellency but the side surfaces of the mask base (mask substrate) MS have a portion having water repellency (water repellent zone) formed so as to surround the entire outer periphery of the mask base (mask substrate) MS. However, the formed water repellent zone preferably functions as a waterproof wall which prevents the cleaning liquid (rinse liquid) from reaching the pattern surface (first main surface) PS1 in a mask-back-surface cleaning step described later.

<Mask-Back-Surface Cleaning Step>

Figure 8:
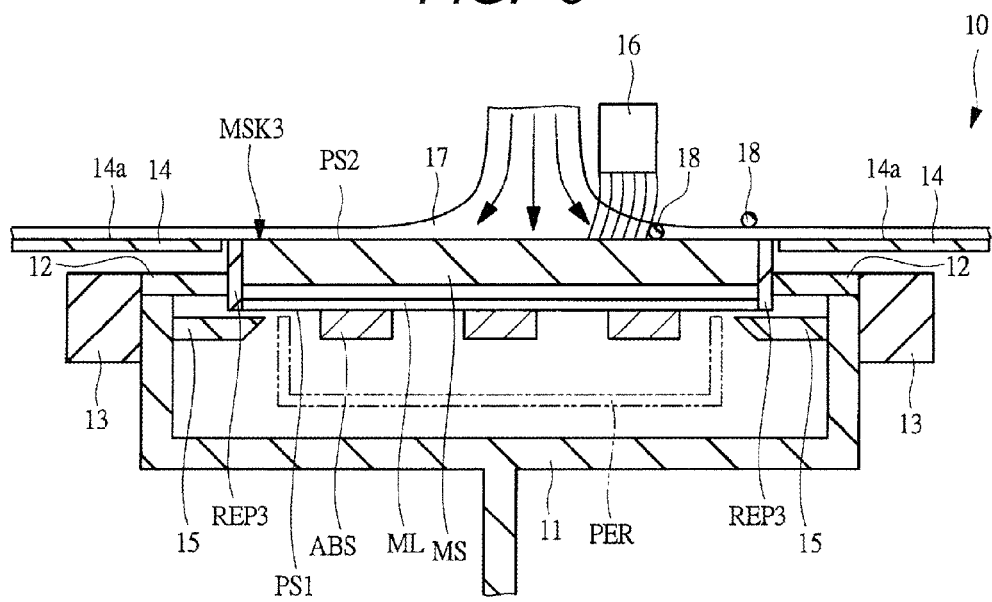
FIG. 8 is a cross-sectional view schematically showing a configuration of a cleaning device for performing a mask-back-surface cleaning step in Embodiment 1.
Figure 9:
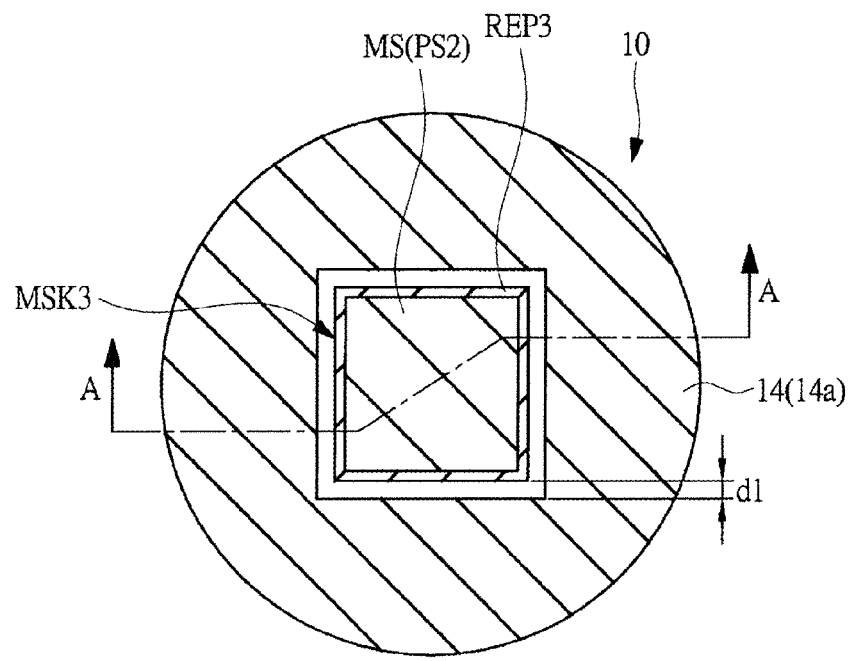
FIG. 9 is a plan view schematically showing the configuration of the cleaning device for performing the mask-back-surface cleaning step in Embodiment 1.
Figure 10:
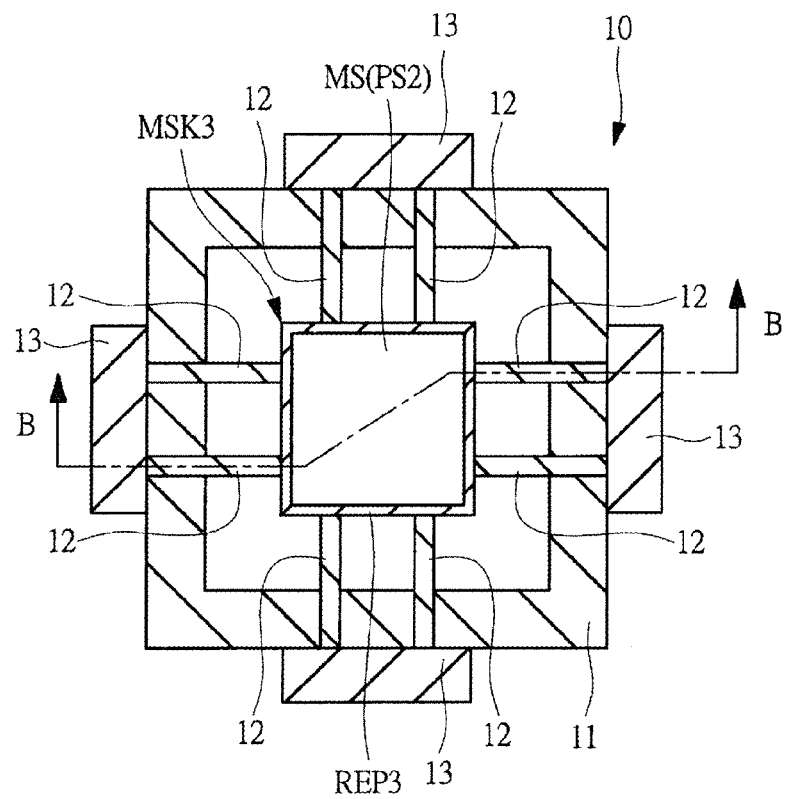
FIG. 10 is a plan view schematically showing the configuration of the cleaning device for performing the mask-back-surface cleaning step in Embodiment 1.

Subsequently, a description will be given of the mask-back-surface cleaning step for cleaning the back surface of the EUV mask. FIG. 8 is a cross-sectional view schematically showing a configuration of a cleaning device for performing a mask-back-surface cleaning step in Embodiment 1. FIGS. 9 and 10 are plan views schematically showing the configuration of the cleaning device for performing the mask-back-surface cleaning step in Embodiment 1. FIG. 8 is a cross-sectional view along the line A-A of FIG. 9, and is also a cross-sectional view along the line B-B of FIG. 10. Note that FIG. 10 shows a state in which a water repellent plate 14 is removed in FIG. 9.

Note that FIG. 8 illustrates the case where the back surface (second main surface) PS2 of the EUV mask MSK3 described using FIG. 6 as the EUV mask is cleaned. In FIG. 8, for easier understanding, the illustration of the capping layer CAP (see FIG. 6), the buffer layers BUF (see FIG. 6), and the conductive film CF (see FIG. 6) each included in the EUV mask MSK3 is omitted.

A cleaning device 10 has a spinner 11, mask pressing pins 12, a drive unit 13, the water repellent plate 14, and an anti-drop claw 15.

By way of example, a description will be given below of the case where the back surface (second main surface) PS2 of the EUV mask MSK3 is cleaned.

The spinner 11 horizontally holds the EUV mask MSK3 with the back surface (second main surface) PS2 of the EUV mask MSK3 facing upward, i.e., with the pattern surface (top surface or first main surface) PS1 thereof facing downward. The spinner 11 is provided rotatable, while holding the EUV mask MSK3. The spinner 11 has the mask pressing pins 12 which are provided correspondingly to the planar shape of the EUV mask MSK3 in plan view. The spinner 11 holds the EUV mask MSK3 by holding the EUV mask MSK3 from both lateral sides using the mask pressing pins 12. Since the EUV mask MSK3 having a quadrilateral planar shape has four side surfaces, the mask pressing pins 12 also correspond to the planar shape of the EUV mask MSK3 and are provided so as to laterally surround the held EUV mask MSK3 from four lateral sides in plan view, as shown in FIG. 10.

The spinner 11 is provided with the drive unit 13. The mask pressing pins 12 are adapted to be pushed out (moved forward) toward the held EUV mask MSK3 or withdrawn (moved backward) by the drive unit 13. When the mask-back-surface cleaning step is performed, the mask pressing pins 12 are pushed out (moved forward) by the drive unit 13 to hold the EUV mask MSK3 therebetween. When the mask-back-surface cleaning step is ended, the mask pressing pins 12 are withdrawn (moved backward) by the drive unit 13 to allow the EUV mask MSK3 to be removed and transported out of the cleaning device 10.

The water repellent plate 14 is provided so as to surround the periphery of the EUV mask MSK3 held on the spinner 11. The water repellent plate 14 is also provided such that an upper surface 14a of the water repellent plate forms the same horizontal plane as that of the back surface (second main surface) PS2 of the EUV mask MSK3. The water repellent plate 14 is for preventing, when a cleaning liquid (rinse liquid) made of, e.g., water (pure water) or the like is supplied to the back surface (second main surface) PS2 of the EUV mask MSK3, the supplied cleaning liquid (rinse liquid) from reaching the pattern surface (top surface or first main surface) PS1 of the EUV mask MSK3. Accordingly, the water repellent plate 14 is formed of a highly water repellent material such as, e.g., a fluorine resin.

As shown in FIG. 9, the distance between the EUV mask MSK3 and the water repellent plate 14 is assumed to be d1. At this time, depending on the angles of contact of the lateral surface portion (side surface portion) REP3 and the water repellent plate 14 with the cleaning liquid (rinse liquid), the distance d1 can be adjusted to be, e.g., about not more than 1 mm, and preferably, e.g., about 200 μm. In such a case, using the surface tension of the cleaning liquid (rinse liquid) made of, e.g., water (pure water) or the like, it is possible to prevent the cleaning liquid from entering the gap between the EUV mask MSK3 and the water repellent plate 14 and prevent the cleaning liquid from reaching the pattern surface (top surface or first main surface) PS1 of the EUV mask MSK3.

Preferably, the outer shape of the water repellent plate 14 in plan view is a circle. This allows the cleaning liquid (rinse liquid) to be drained well from the outer periphery of the water repellent plate 14 when the cleaning liquid (rinse liquid) is supplied to the back surface (second main surface) PS2, while the EUV mask MSK3 is rotated, and allows the back surface (second main surface) PS2 of the EUV mask MSK3 to be uniformly cleaned and dried.

Preferably, the cleaning device 10 has the anti-drop claw 15 which prevents the EUV mask MSK3 from falling down during a blackout or a low-power period.

The cleaning device 10 holds the EUV mask MSK3 by holding the side surfaces thereof between the mask pressing pins 12 provided on the spinner 11, and does not hold the EUV mask MSK3 through contact with the pattern surface (top surface or first main surface) PS1. By adopting such a holding method, for the EUV mask MSK3 to which a pellicle PER can be attached also, it is possible to hold the EUV mask MSK3 with the pellicle PER being attached thereto using the spinner 11. As a result, when the mask-back-surface cleaning step is performed, it is possible to prevent foreign materials from adhering to the pattern surface (top surface or first main surface) PS1. Alternatively, for the EUV mask MSK3 to which, e.g., the inner lid of a double pod can be attached instead of the pellicle PER also, it is possible to hold the EUV mask MSK3 with the inner lid being attached thereto using the spinner 11. In this case also, in the same manner as in the case where the EUV mask MSK3 is held with the pellicle PER being attached thereto, it is possible to prevent foreign materials from adhering to the pattern surface (top surface or first main surface) PS1.

Preferably, the cleaning device 10 has a brush 16 provided above the EUV mask MSK3 held on the spinner 11. The brush 16 is provided to be able to come in contact with the back surface (second main surface) PS2 of the EUV mask MSK3 held on the spinner 11. In the mask-back-surface cleaning step, the foreign materials adhering to the back surface (second main surface) PS2 of the EUV mask MSK3 is stripped to be removed.

In the foregoing cleaning device 10, the EUV mask MSK3 is held on the spinner 11 using the mask pressing pins 12 such that the pattern surface (top surface or first main surface) PS1 faces downward and the back surface (second main surface) PS2 faces upward. Then, while the EUV mask MSK3 is rotated by the spinner 11, a cleaning liquid (rinse liquid) 17 made of, e.g., water (pure water) or the like is supplied from above the EUV mask 3 with, e.g., a nozzle (the illustration thereof is omitted). The cleaning liquid (rinse liquid) 17 supplied to the back surface (second main surface) PS2 of the EUV mask MSK3 then flows toward the outer periphery of the EUV mask MSK3 due to a centrifugal force to remove the foreign materials 18 adhering to the back surface (second main surface) PS2. At this time, by using the cleaning liquid (rinse liquid) 17 and the brush 16 in combination and stripping and removing the foreign materials 18, the rate of removal of the foreign materials 18 can be improved.

The number of rotations of the spinner 11 in the mask-back-surface cleaning step can be preferably adjusted to, e.g., about several tens to one thousand five hundred per second depending on the shape and size of the EUV mask MSK3.

The water repellency of the lateral surface portions (side surface portions) REP3 of the EUV mask MSK3 is preferably maximized, but the angle of contact with water (pure water) is preferably not less than 70°. When the angle of contact with water (pure water) is not less than 70°, in the mask-back-surface cleaning step, it is possible to reliably prevent the cleaning liquid (rinse liquid) made of, e.g., water (pure water) or the like from reaching the pattern surface (top surface or first main surface) PS1 side of the EUV mask MSK3. However, if consideration is given to the case where a pressure when the cleaning liquid (rinse liquid) is ejected increases and the case where the distance d1 between the EUV mask MSK3 and the water repellent plate 14 increases due to the displacement of the EUV mask MSK3 and a size tolerance therefor, the angle of contact with water (pure water) is more preferably not less than 90°. Additionally, if consideration is given to the case where the pressure when the cleaning liquid (rinse liquid) is ejected further increases and the case where the distance d1 between the EUV mask MSK3 and the water repellent plate 14 further increases, the angle of contact with water (pure water) is still more preferably not less than 110°.

In the description of the mask-back-surface cleaning step given above, the description has been given by way of example to the case where the back surface (second main surface) PS2 of the EUV mask MSK3 is cleaned. However, in the case where the back surface of the EUV mask MSK1 (see FIG. 3), the EUV mask MSK2 (see FIG. 5), or the EUV mask MSK4 (see FIG. 7) is cleaned also, it is possible to prevent the cleaning liquid (rinse liquid) from reaching the pattern surface (top surface or first main surface) PS1 of the EUV mask. In addition, in the case where the back surface of the EUV mask MSK1 (see FIG. 3), the EUV mask MSK2 (see FIG. 5), or the EUV mask MSK4 (see FIG. 7) is cleaned also, the rate of removal of the foreign materials 18 can be improved by using the cleaning liquid (rinse liquid) 17 and the brush 16 in combination and stripping and removing the foreign materials 18.

<Exposure Step>

Figure 11:
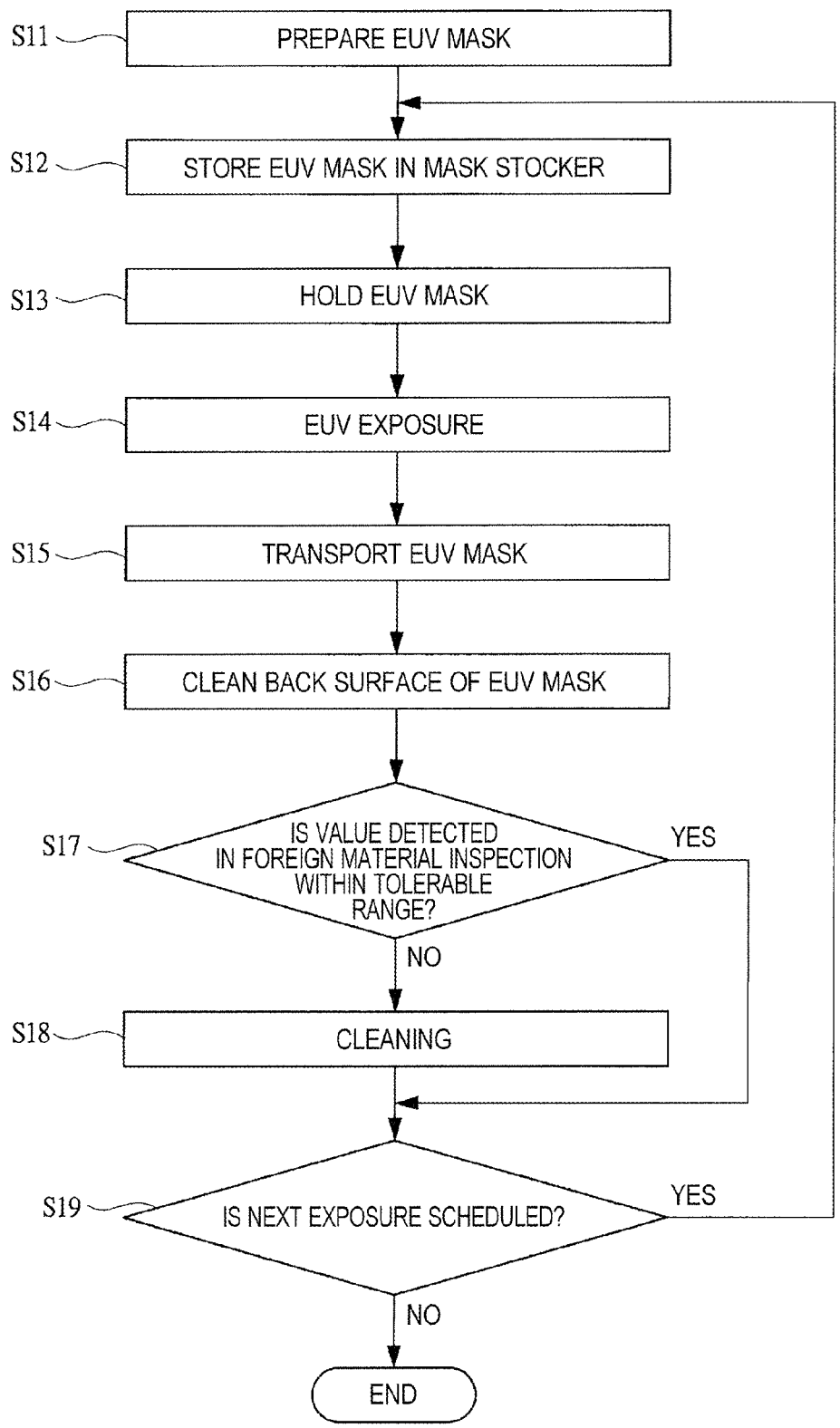
FIG. 11 is a flow chart showing a part of an exposure step in Embodiment 1.

Subsequently, a description will be given to an exposure step for exposing a wafer using the exposure device 1 (see FIG. 1), which includes the mask-back-surface cleaning step described above, with reference to FIG. 11. FIG. 11 is a flow chart showing a part of the exposure step in Embodiment 1.

First, the EUV mask MSK1 (see FIG. 3) for performing pattern exposure using EUV light as exposure light is provided (Step S11). The provided EUV mask MSK1 is moved to the mask stocker (the illustration thereof is omitted) of the exposure device 1 and stored therein (Step S12).

As shown in FIG. 3, the EUV mask MSK1 has the pattern surface (top surface or first main surface) PS1 formed with the exposure pattern, the back surface (second main surface) PS2 opposite to the pattern surface (top surface or first main surface) PS1, and the side surfaces SS1 disposed between the pattern surface (top surface or first main surface) PS1 and the back surface (second main surface) PS2. As described above, each of the side surfaces SS1 of the EUV mask MSK1 has water repellency. In addition, the back surface (second main surface) PS2 of the EUV mask MSK1 has been cleaned by performing a mask-back-surface cleaning step as described above.

A description will be given below of an example using the EUV mask MSK1. However, instead of the EUV mask MSK1, the EUV mask MSK2 (see FIG. 5), the EUV mask MSK3 (see FIG. 6), or the EUV mask MSK4 (see FIG. 7) can also be used.

Next, the EUV mask MSK1 (see FIG. 3) is held (mask holding step of Step S13). In the mask holding step (Step S13), the EUV mask MSK1 stored in the mask stocker (the illustration thereof is omitted) is transported to the exposure mechanism unit 1a (see FIG. 1) of the exposure device 1 (see FIG. 1) by a mask transportation device (the illustration thereof is omitted). Then, as shown in FIG. 1, the EUV mask MSK1 is electrostatically sucked by the electrostatic chuck 4a with the back surface (second main surface) PS2 of the transported EUV mask MSK1 being in contact with the lower surface (surface) 4b of the electrostatic chuck 4a. By such a method, the EUV mask MSK1 is held on the mask stage (holder) 4.

Next, EUV exposure is performed (EUV exposure step of Step S14). In the EUV exposure step (Step S14), as shown in FIG. 1, the wafer 21 formed with a resist film is held on the wafer stage 6 of the exposure mechanism unit 1a with the EUV mask MSK1 being held on the mask stage (holder) 4 and, using the EUV mask MSK1, the held wafer 21 is subjected to pattern exposure. After the wafer 21 subjected to the pattern exposure is transported from the wafer stage 6, the next wafer 21 is held on the wafer stage 6, and the held next wafer 21 is subjected to pattern exposure. In this manner, the plurality of predetermined wafers 21 are continuously subjected to pattern exposure. Note that the details of the step of subjecting the resist film formed over each of the wafers 21 to the pattern exposure will be described using FIG. 13 described later.

After the plurality of predetermined wafers 21 are thus continuously subjected to the pattern exposure, the EUV mask MSK1 is transported (mask transportation step of Step S15). In the mask transportation step (Step S15), the electrostatic suction of the EUV mask MSK1 by the electrostatic chuck 4a of the mask stage (holder) 4 is stopped, and the EUV mask MSK1 the electrostatic suction of which is stopped is removed and transported from the mask stage (holder) 4.

Next, the back surface (second main surface) PS2 of the EUV mask MSK1 is cleaned (mask-back-surface cleaning step of Step S16). In the mask-back-surface cleaning step (Step S16), as shown in FIG. 8, the back surface of the EUV mask MSK1 is cleaned using the cleaning device 10. When the EUV mask MSK1 is held on the mask stage (holder) 4 or transported from the mask stage (holder) 4, the foreign materials adhering to the back surface (second main surface) PS2 of the EUV mask MSK1 are easily removed without adhering to the pattern surface (top surface or first main surface) PS1, as shown in FIG. 8.

Next, the foreign material inspection of the pattern surface (top surface or first main surface) PS1 of the EUV mask MSK1 is performed to determine whether or not the value detected in the foreign material inspection is within a tolerable range (foreign material inspection step of Step S17). The foreign materials detected in the foreign material inspection step (Step S17) are produced during the EUV exposure step (Step S14), and the majority thereof contains carbon. However, some of the foreign materials contain a film or foreign materials resulting from, e.g., the growth of an oxide film at the pattern surface (top surface or first main surface) PS1.

When the value detected in the foreign material inspection in the foreign material inspection step (Step S17) is not within the tolerable range, i.e., when the detected value exceeds the upper limit value in the tolerable range, cleaning is performed (cleaning step of Step S18). For the cleaning step (Step S18), a method which oxidizes the foreign materials using a combination of deep ultraviolet (DUV) and ozone gas or the like and removes the reduced foreign materials, a method which reduces the foreign materials with atomic hydrogen or the like and removes the reduced foreign materials, or a wet cleaning method which performs cleaning using a cleaning liquid (rinse liquid) can be used. For the cleaning step (Step S18), the method described above can also be used in combination. On the other hand, when the value detected in the foreign material inspection is within the tolerable range, i.e., when the detected value is not more than the upper limit value in the tolerable range, cleaning need not be performed.

Note that the foreign material inspection step (Step S17) and the cleaning step (Step S18) need not be performed every time after the mask transportation step is performed. That is, the foreign material inspection step (Step S17) and the cleaning step (Step S18) may also be included as optional steps.

Next, it is determined whether or not next exposure is scheduled (scheduled exposure determination step of Step S19). Then, when next exposure is scheduled, the EUV mask MSK1 is moved to the mask stocker (the illustration thereof is omitted) of the exposure device 1 (see FIG. 1) and stored therein (Step S12). On the other hand, when next exposure is not scheduled, the exposure step is ended.

<Manufacturing Process of Semiconductor Device>

Subsequently, a description will be given of the manufacturing process of the semiconductor device, which includes the exposure step described above, with reference to FIGS. 12 to 16. FIGS. 12 to 16 are main-portion cross-sectional views of the semiconductor device of Embodiment 1 during the manufacturing process thereof.

Figure 13:
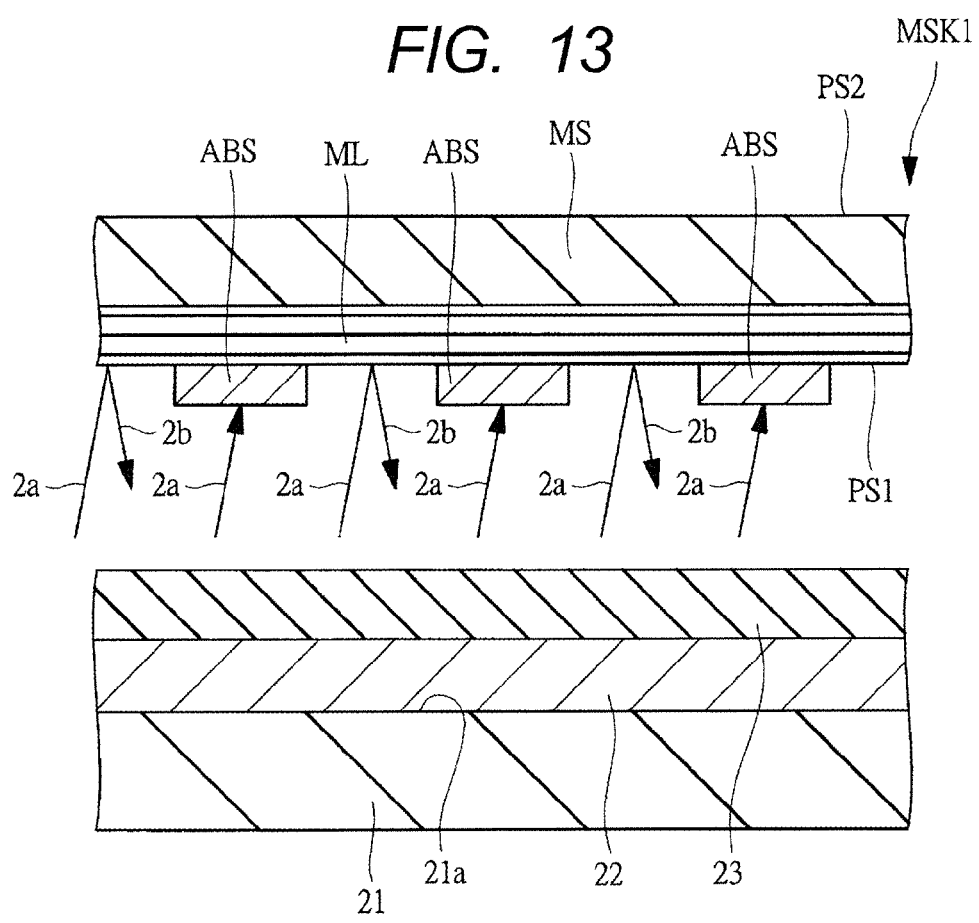
FIG. 13 is a main-portion cross-sectional view of the semiconductor device of Embodiment 1 during the manufacturing process thereof.

Note that, in FIG. 13, for easier understanding, the illustration of the capping layer CAP (see FIG. 3), the buffer layers BUF (see FIG. 3), and the conductive film CF (see FIG. 3) each included in the EUV mask MSK1 is omitted.

A description will be given below of an example in which a film to be processed (film to be etched) is formed over the main surface of a wafer and the film to be processed (film to be etched) is processed (etched) into a desired pattern.

Figure 12:
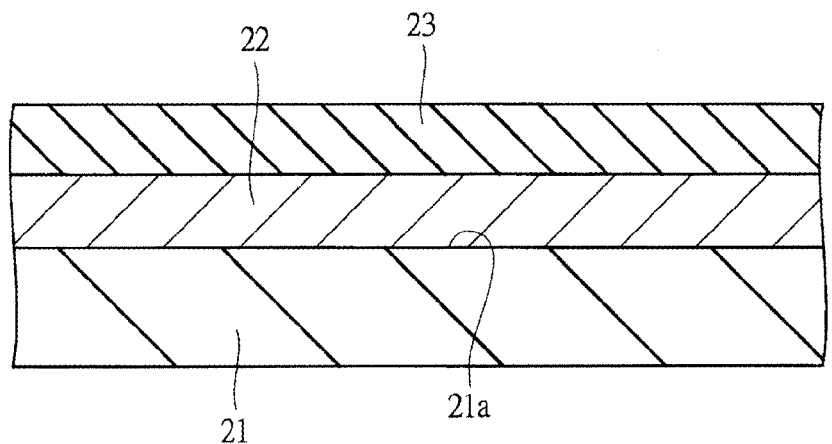
FIG. 12 is a main-portion cross-sectional view of a semiconductor device of Embodiment 1 during a manufacturing process thereof.

First, over the film to be processed (film to be etched) formed over the main surface of the wafer, a resist film (photoresist film) is formed (resist film formation step). In the resist film formation step, first, as shown in FIG. 12, the wafer 21 is provided which has a film to be processed (film to be etched) 22 formed over the main surface 21a of the wafer 21. Then, onto the film to be processed (film to be etched) 22, a resist (photoresist) is applied and subjected to heat treatment to form a resist film (photoresist film) 23. As shown in FIG. 12, in EUV lithography, an anti-reflection film or the like need not be formed between the resist film (photoresist film) 23 and the film to be processed 22. However, it is also possible to form an adhesion enhancing film (the illustration thereof is omitted) for enhancing the adhesion between the resist film (photoresist film) 23 and the film to be processed (film to be etched) 22 and preventing pattern collapse between the resist film (photoresist film) 23 and the film to be processed (film to be etched) 22. Alternatively, it is also possible to form a hard mask (the illustration thereof is omitted) for compensating for the insufficient etching resistance of the resist film (photoresist film) 23 between the resist film (photoresist film) 23 and the film to be processed (film to be etched) 22.

Next, using EUV light as exposure light, the resist film (photoresist film) is exposed (EUV exposure step). The EUV exposure step can be performed similarly to the EUV exposure step (Step S14 of FIG. 11) described using FIG. 11. Specifically, as shown in FIG. 13, the exposure light 2a is caused to be incident on (irradiate) the EUV mask MSK1 having the exposure pattern formed over the pattern surface (top surface or first main surface) PS1 and including the multilayer reflection film (reflection film) ML and the absorber patterns ABS. The exposure light 2a incident on (irradiating) the multilayer reflection film (reflection film) ML is reflected by the multilayer reflection film (reflection film) ML to become the reflected light 2b. On the other hand, the exposure light 2a incident on (irradiating) the absorber patterns ABS is absorbed by the absorber patterns ABS and is not reflected. As a result, the reflected light 2b resulting from the reflection by the multilayer reflection film (reflection film) ML is caused to irradiate the resist film (photoresist film) 23 via the reduction projection optical system 5 (see FIG. 1). In this manner, the resist film (photoresist film) 23 is subjected to pattern exposure using the exposure pattern including the multilayer reflection film (reflection film) ML and the absorber patterns ABS.

Note that, as described above, as the EUV mask, instead of the EUV mask MSK1, the EUV mask MSK2 (see FIG. 5), the EUV mask MSK3 (see FIG. 6), or the EUV mask MSK4 (see FIG. 7) can also be used.

Figure 14:
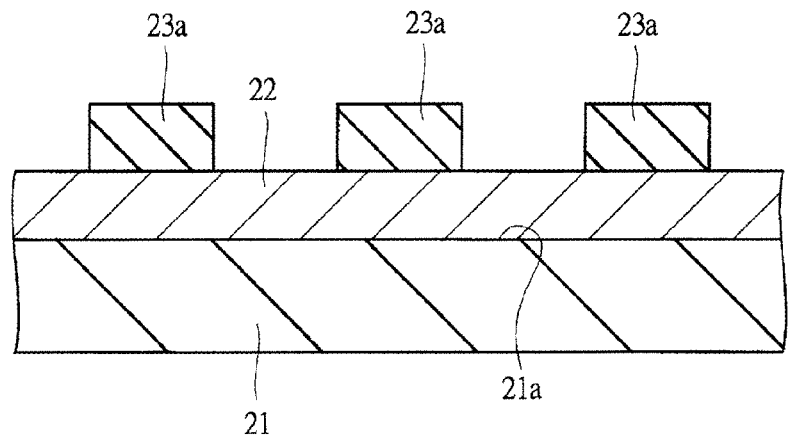
FIG. 14 is a main-portion cross-sectional view of the semiconductor device of Embodiment 1 during the manufacturing process thereof.

Next, the resist film (photoresist film) subjected to the pattern exposure is developed (development step). In the development step, the resist film (photoresist film) 23 (see FIG. 13) subjected to the pattern exposure is developed to form a resist pattern 23a to which the exposure pattern of the EUV mask MSK1 (see FIG. 13) including the absorber patterns ABS (see FIG. 13) has been transferred, as shown in FIG. 14.

Figure 15:
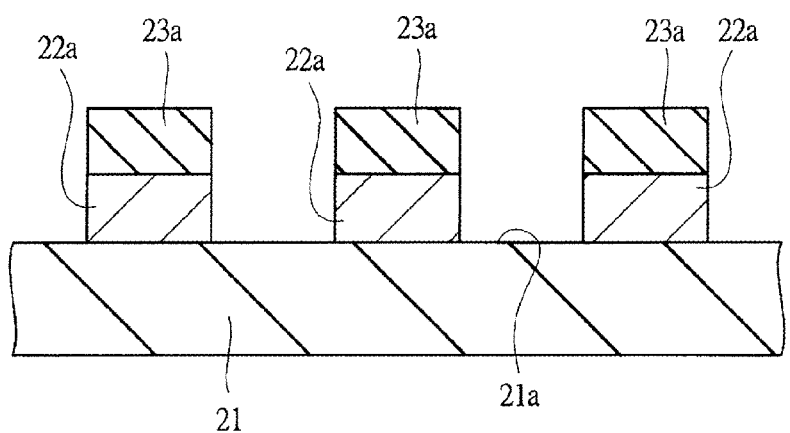
FIG. 15 is a main-portion cross-sectional view of the semiconductor device of Embodiment 1 during the manufacturing process thereof.
Figure 16:
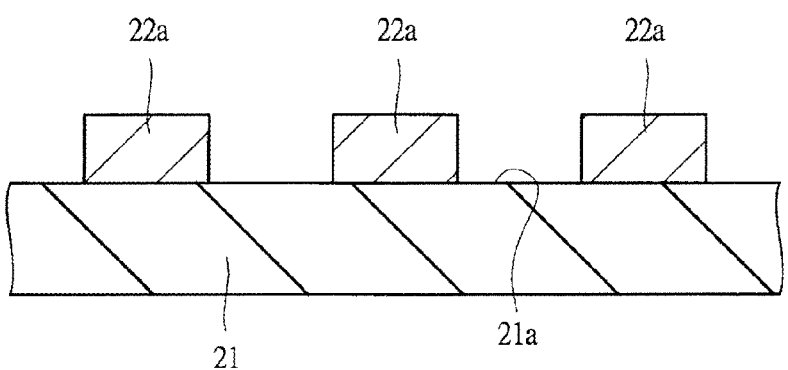
FIG. 16 is a main-portion cross-sectional view of the semiconductor device of Embodiment 1 during the manufacturing process thereof.

Next, the film to be processed (film to be etched) is etched (etching step). In the etching step, using the resist pattern 23a as an etching mask, the film to be processed (film to be etched) 22 (see FIG. 14) is processed (etched). In this manner, as shown in FIG. 15, over the wafer 21, a pattern 22a which is formed of the processed film (etched film) 22 (see FIG. 14) and to which the exposure pattern of the EUV mask MSK1 (see FIG. 13) including the absorber pattern ABS (see FIG. 13) has been transferred is formed. Then, as shown in FIG. 16, the resist pattern 23a is removed by, e.g., asking or the like.

<About Adhesion of Foreign Materials>

Figure 17:
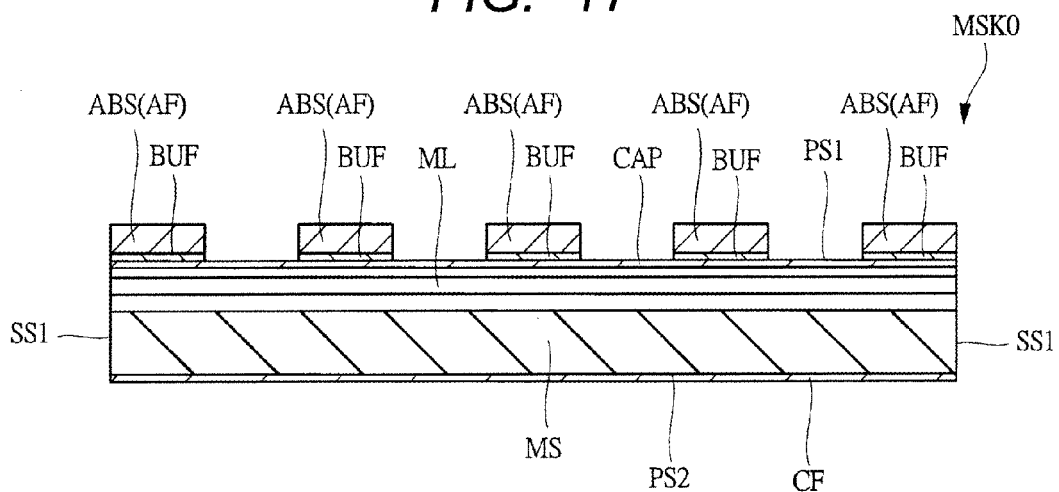
FIG. 17 is a main-portion cross-sectional view showing a part of an EUV mask of a comparative example.
Figure 18:
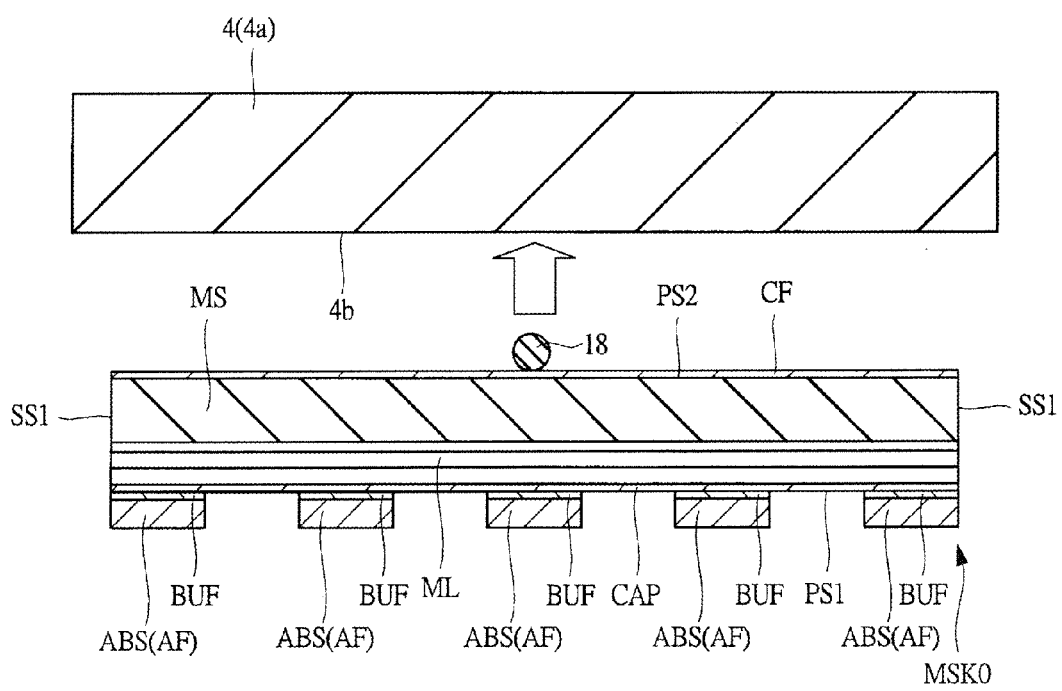
FIG. 18 is a cross-sectional view for illustrating the occurrence of displacement of an exposure pattern in the EUV mask of the comparative example when foreign materials adhere to the back surface thereof.
Figure 19:
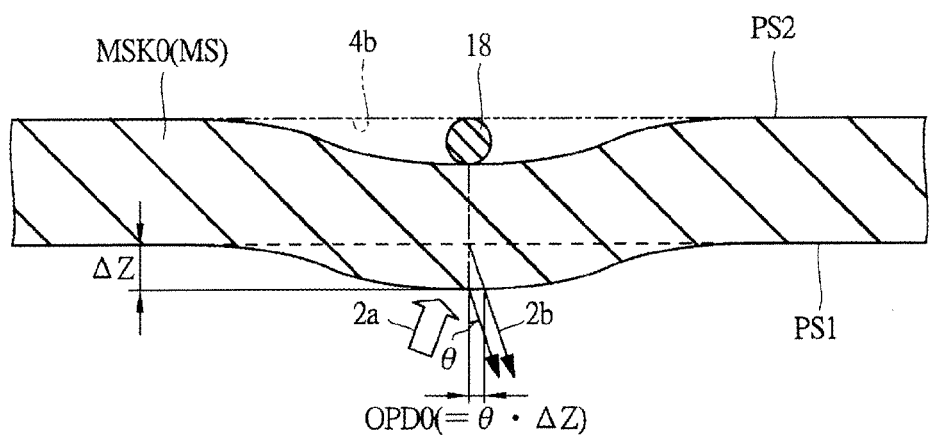
FIG. 19 is a cross-sectional view for illustrating the occurrence of displacement of the exposure pattern in the EUV mask of the comparative example when foreign materials adhere to the back surface thereof.
Figure 20:
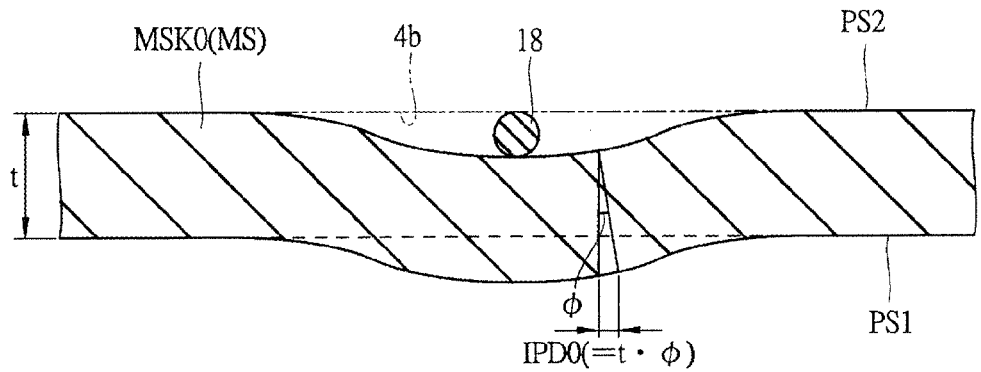
FIG. 20 is a cross-sectional view for illustrating the occurrence of displacement of the exposure pattern in the EUV mask of the comparative example when foreign materials adhere to the back surface thereof.
Figure 21:
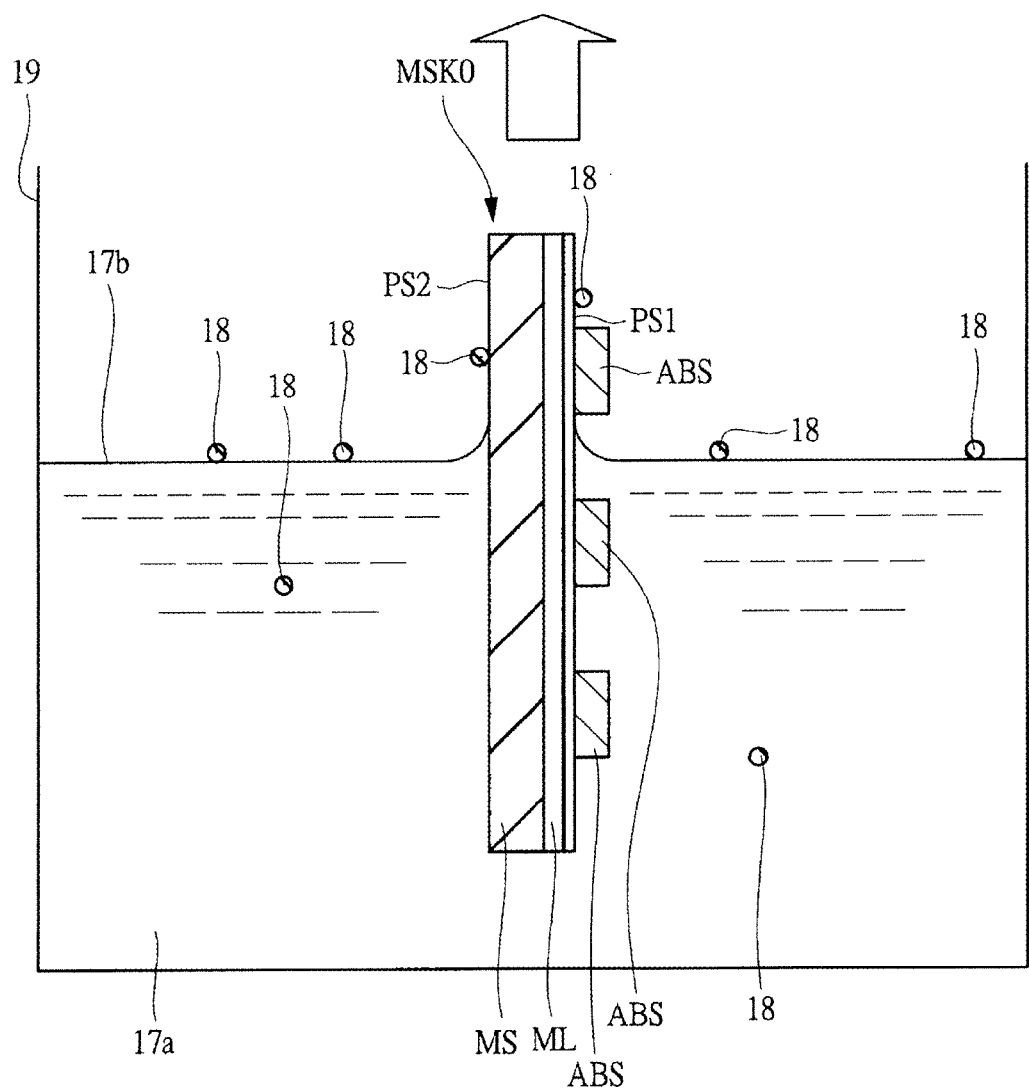
FIG. 21 is a cross-sectional view for illustrating further adhesion of foreign materials when the EUV mask is cleaned.

FIG. 17 is a main-portion cross-sectional view showing a part of an EUV mask of a comparative example. FIGS. 18 to 20 are cross-sectional views for illustrating the occurrence of displacement of an exposure pattern in the EUV mask of the comparative example when foreign materials adhere to the back surface thereof. FIG. 21 is a cross-sectional view for illustrating further adhesion of foreign materials when the EUV mask is cleaned.

Note that, in FIGS. 19 and 20, for easier understanding, of an EUV mask MSK0, only the mask base (mask substrate) MS is shown, while the illustration of the multilayer reflection film (reflection film) ML (see FIG. 17), the capping layer CAP (see FIG. 17), the buffer layers BUF (see FIG. 17), the absorber patterns ABS (see FIG. 17), and the conductive film CF (see FIG. 17) each included in the EUV mask MSK0 is omitted. Also in FIGS. 19 and 20, for easier understanding, the illustration of the electrostatic chuck 4a (see FIG. 18) is omitted and the position of the lower surface (surface) 4b of the electrostatic chuck 4a is shown by the two-dot-dash line. On the other hand, in FIG. 21, for easier understanding, the illustration of the capping layer CAP (see FIG. 3), the buffer layers BUF (see FIG. 3), and the conductive film CF (see FIG. 3) each included in the EUV mask MSK0 is omitted.

As shown in FIG. 17, the pattern surface (top surface or first main surface) PS1 and the back surface (second main surface) PS2 of the EUV mask MSK0 of the comparative example respectively correspond to the pattern surface (top surface or first main surface) PS1 and the back surface (second main surface) PS2 of the EUV mask MSK1 (see FIG. 3). As also shown in FIG. 17, the mask base (mask substrate) MS, the multilayer reflection film (reflection film) ML, the capping layer CAP, and the buffer layers BUF of the EUV mask MSK0 of the comparative example respectively correspond to the mask base (mask substrate) MS, the multilayer reflection film (reflection film) ML, the capping layer CAP, and the buffer layers BUF of the EUV mask MSK1 (see FIG. 3). As also shown in FIG. 17, the absorber patterns ABS of the EUV mask MSK0 of the comparative example correspond to the absorber patterns ABS of the EUV mask MSK1 (see FIG. 3) and are each formed of the absorber film AF, similarly to the absorber patterns ABS of the EUV mask MSK1 (see FIG. 3).

On the other hand, as shown in FIG. 17, the side surfaces SS1 of the EUV mask MSK0 of the comparative example are not formed with the lateral surface portions (side surface portions) REP1 which are formed over the side surfaces SS1 (see FIG. 3) of the EUV mask MSK1 (see FIG. 3).

In the EUV mask MSK0, as shown in FIG. 18, when the EUV mask MSK0 is electrostatically sucked by the electrostatic chuck 4a with the foreign materials 18 adhering to the back surface PS2 of the EUV mask MSK0, the foreign materials 18 are interposed between the lower surface (surface) 4b of the electrostatic chuck 4a and the back surface PS2 of the EUV mask MSK0. When the foreign materials 18 are interposed between the lower surface (surface) 4b of the electrostatic chuck 4a and the back surface PS2 of the EUV mask MSK0, in the vicinity of the foreign materials 18, as shown in FIGS. 19 and 20, the EUV mask MSK0 is deformed. The deformation is called OPD (Out-of-Plane Distortion) and IPD (In Plane Distortion).

When the OPD has occurred, as shown in FIG. 19, the height position of the pattern surface (top surface) PS1 as the lower surface of the EUV mask MSK0 changes by $\Delta z$. The change $\Delta z$ in height position causes displacement along a horizontal direction in the transferred pattern. Here, an angle between the reflected light 2b resulting from the reflection of the exposure light 2a incident on (irradiating) the pattern surface (top surface) PS1 of the EUV mask MSK0 by the pattern surface (top surface) PS1 and a direction perpendicular to the pattern surface (top surface) PS1 is assumed to be $\theta$. When the displacement caused by the OPD along the horizontal direction in the transferred pattern is assumed to be OPD0, the OPD0 is given by the following expression (1):

$$OPD0 = \theta \cdot \Delta z \quad (1).$$

When the IPD has occurred, as shown in FIG. 20, the EUV mask MSK0 is locally inclined from a horizontal plane by an angle, and the local inclination causes the displacement along the horizontal direction in the transferred pattern. Here, when it is assumed that the thickness of the EUV mask MSK0 is t, and the displacement caused by the IPD along the horizontal direction in the transferred pattern is IPD0, the IPD0 is given by the following expression (2):

$$IPD0 = t \cdot \quad (2).$$

The EUV light has an extremely short wavelength and is absorbed by the mask base (mask substrate) MS made of, e.g., quartz glass. Therefore, as described above, in the EUV lithography, not the transmission-type mask, but the reflection-type mask is used as the EUV mask MSK0 and, not a transmission optical system, but a reflection optical system is used as an optical system. In addition, to prevent the reflected light 2b resulting from the reflection by the pattern surface (top surface) PS1 from being intercepted by an incidence optical system which causes the exposure light 2a to be incident on the pattern surface (top surface) PS1, the exposure light 2a is caused to be incident (obliquely incident) on the pattern surface (top surface) PS1 of the EUV mask MSK0 in a direction oblique at, e.g., about 6° (i.e., $\theta=6°$) from a direction perpendicular to the pattern surface (surface) PS1 of the EUV mask MSK0. As a result, when the height position of the pattern surface (top surface) PS1 of the EUV mask MSK0 changes, as shown in FIG. 19 and the foregoing expression (1), displacement occurs in the pattern transferred to the resist film formed over the wafer by exposure.

Since the surface member of the electrostatic chuck 4a is required to have an insulation property and rigidity, it is made of, e.g., ceramic, quartz, or the like. However, since ceramic and quartz is bristle, when the operation of holding the EUV mask MSK0 using the electrostatic chuck 4a and the operation of transporting the EUV mask MSK0 from the electrostatic chuck 4a are repeated, the surface member chips to generate a large number of the foreign materials 18. When the number of the generated foreign materials 18 is evaluated based on the number of the foreign materials 18 adhering to the entire back surface PS2 of the transported EUV mask MSK0 after the exposure, the number of the generated foreign materials 18 is about one million when no countermeasures are taken and is about several hundred even when countermeasures are taken.

The lower limit value of the sizes (diameters) of the foreign materials 18 determined to cause displacement in the pattern transferred by the OPD or IPD described above, i.e., cause a transfer defect is about 20 to 100 μm at present, though it depends on the minimum size of the transferred pattern. When the EUV mask MSK0 to which about several hundreds of the foreign material 18 adhere are electrostatically sucked by the electrostatic chuck 4a, between the back surface PS2 of the EUV mask MSK0 and the lower surface (surface) 4b of the electrostatic chuck 4a, the foreign materials 18 having sizes (e.g., about 20 to 100 nm) determined to cause the transfer defect described above are interposed. As a result, displacement occurs in the transferred pattern to degrade the accuracy of the shape of the circuit pattern of the manufactured semiconductor device, resulting in the problem of degrading the performance of the semiconductor device.

When a time not shorter than a given period has elapsed with the EUV mask MSK0 being electrostatically sucked by the electrostatic chuck 4a, even after the electrostatic suction is stopped, the back surface PS2 is fixedly attached to the lower surface (surface) 4b of the electrostatic chuck 4a, and the EUV mask MSK0 cannot be easily removed from the electrostatic chuck 4a. In such a case, to remove the EUV mask MSK0 from the electrostatic chuck 4a, it is necessary to press the back surface PS2 of the EUV mask MSK0 with a pin or the like. At that time, the back surface PS2 may be damaged to result in the production of the foreign materials 18, and the produced foreign materials 18 may adhere to the back surface PS2. In such a case also, the problem arises that, when the EUV mask MSK0 is electrostatically sucked again by the electrostatic chuck 4a, the foreign materials 18 described above are interposed between the back surface PS2 of the EUV mask MSK0 and the lower surface (surface) of the electrostatic chuck 4a.

There is also a case where, to the pattern surface (top surface) PS1 of the EUV mask MSK0, a pellicle which prevents the foreign materials 18 from adhering to the pattern surface (top surface) PS1 is not stuck and the EUV mask MSK0 is used as a so-called pellicle-less mask. In such a case, when the EUV mask MSK0 is transported while being in contact with an arm of the mask transportation device or when the EUV mask MSK0 is transported while being held on the electrostatic chuck 4a or after removed from the electrostatic chuck 4a, the foreign materials 18 are produced. The produced foreign materials 18 adhere to the pattern surface (top surface) PS1 of the EUV mask MSK0 and, due to the adhering foreign materials 18, a transfer defect arises in the pattern transferred to the resist film.

To remove the foreign materials 18, it may be considered to clean the back surface PS2 of the EUV mask MSK0 or clean the entire EUV mask MSK0.

To clean the back surface PS2 of the EUV mask MSK0, there is a method in which, e.g., the side surfaces SS1 of the EUV mask MSK0 are held, a treatment liquid (cleaning liquid) is brought into contact with the back surface PS2, and gas is ejected toward the treatment liquid (cleaning liquid) to separate the treatment liquid (cleaning liquid) from the EUV mask MSK0. However, according to such a method, the foreign materials 18 adhering to the back surface PS2 are cleaned away only with the treatment liquid (cleaning liquid), and consequently the foreign materials 18 cannot be easily removed from the back surface PS2.

On the other hand, to clean the entire EUV mask MSK0, there is a method (batch wet cleaning) such as, e.g., SPM (Sulfuric acid-Hydrogen Peroxide Mixture) cleaning in which, as shown in FIG. 21, the EUV mask MSK0 is immersed in a cleaning liquid 17a stored in a reservoir tank 19 to be cleaned of the foreign materials. However, when the batch wet cleaning is performed with the foreign materials 18 adhering to the back surface PS2, as shown in FIG. 21, some of the foreign materials 18 removed from the back surface PS2 of the EUV mask MSK0 are diffused into the cleaning liquid 17a, but the majority of the foreign materials 18 removed from the back surface PS2 of the EUV mask MSK0 float on a surface 17b of the cleaning liquid 17a. As a result, when the EUV mask MSK0 is raised out of the cleaning liquid 17a, the foreign materials 18 adhere to the back surface PS2 of the EUV mask MSK0 and to the pattern surface (top surface) PS1 thereof. For example, in the case where the EUV mask MSK0 having about one million foreign materials 18 adhering to the back surface PS2 thereof is subjected to the batch wet cleaning, when the EUV mask MSK0 is raised out of the cleaning liquid 17a, to the pattern surface (top surface) PS1, e.g., about one thousand foreign materials 18 may adhere, though it depends on the size of the reservoir tank 19.

<Main Features and Effects of Embodiment 1>

In Embodiment 1, as shown in FIG. 3, the side surfaces SS1 of the EUV mask MSK1 are formed with the lateral surface portions (side surface portions) REP1 having water repellency. Since the lateral surface portions (side surface portions) REP1 are formed, the water repellency of the side surfaces SS1 is higher than the water repellency of the back surface (second main surface) PS2.

Therefore, when the EUV mask MSK1 is subjected to the mask-back-surface cleaning step (see FIG. 8), it is possible to prevent or inhibit the cleaning liquid (rinse liquid) 17 (see FIG. 8) supplied to the back surface (second main surface) PS2 from reaching the side surfaces SS1. Alternatively, it is possible to increase the pressure of the cleaning liquid (rinse liquid) 17 ejected toward the back surface (second main surface) PS2, while preventing or inhibiting the cleaning liquid (rinse liquid) 17 supplied to the back surface (second main surface) PS2 from reaching the side surfaces SS1. Accordingly, compared to the case where the batch wet cleaning is performed, it is possible to more reliably prevent or inhibit the foreign materials 18 (see FIG. 8) from adhering to the pattern surface (top surface or first main surface) PS1, more easily remove the foreign materials 18 adhering to the back surface (second main surface) PS2 of the EUV mask MSK1, improve the accuracy of the shape of the circuit pattern of the manufactured semiconductor device, and improve the performance of the semiconductor device.

Preferably, when the mask-back-surface cleaning step (see FIG. 8) for the EUV mask MSK1 is performed, the foreign materials 18 adhering to the back surface (second main surface) PS2 of the EUV mask MSK1 is removed using the brush (see FIG. 8). By performing cleaning using the cleaning liquid 17 (see FIG. 8) and the brush 16 in combination, it is possible to strip the foreign materials 18 adhering to the back surface (second main surface) PS2 of the EUV mask MSK1 therefrom with the brush 16 and allow the cleaning liquid 17 to flow away the stripped foreign materials 18 toward the outer peripheral side of the EUV mask MSK1. Therefore, it is possible to easily remove the foreign materials 18 adhering to the back surface (second main surface) PS2 of the EUV mask MSK1, improve the accuracy of the shape of the circuit pattern of the manufactured semiconductor device, and improve the performance of the semiconductor device.

In addition, by performing the mask-back-surface cleaning step (see FIG. 8), even when the EUV mask MSK1 is removed from the electrostatic chuck 4a by pressing the back surface (second main surface) PS2 of the EUV mask MSK1 with a pin or the like, it is possible to reliably remove the foreign materials 18 adhering to the back surface (second main surface) PS2. Also, by performing the mask-back-surface cleaning step (see FIG. 8), compared to the case where the EUV mask is cleaned by the batch wet cleaning shown in FIG. 21, it is possible to more easily prevent the foreign materials 18 from adhering to the pattern surface (top surface or first main surface) PS1.

Moreover, in Embodiment 1, the water repellency of the side surface SS1 is higher than the water repellency of the pattern surface (top surface or first main surface) PS1. In other words, the water repellency at the bottom surface and side walls of the space portion (opening) SPC (see FIG. 3) is lower than the water repellency of the side surface SS1. Accordingly, even when the aspect ratio which is the ratio of the height T1 (see FIG. 3) of the space portion (opening) SPC (see FIG. 3) to the width W1 (see FIG. 3) thereof is high, the cleaning liquid (rinse liquid) can easily enter the space portion (opening) SPC.

Therefore, when the back surface (second main surface) PS2 is cleaned, the cleaning liquid (rinse liquid) is prevented from reaching the pattern surface (top surface or first main surface) PS1 while, when the cleaning step for cleaning the pattern surface (top surface or first main surface) PS1 is performed, it is possible to prevent or inhibit the cleaning ability to clean the pattern surface (top surface or first main surface) PS1 from deteriorating. This allows a reduction in defects in the circuit pattern of the manufactured semiconductor device, a further improvement in the accuracy of the shape thereof, and a further improvement in the performance of the semiconductor device.

Even when the EUV mask MSK1 is used as a pellicle-less mask, the foreign materials 18 adhering to the pattern surface (top surface or first main surface) can be reliably removed.

On the other hand, as shown in FIG. 5, the side surfaces SS1 of the EUV mask MSK2 are formed with the lateral surface portions (side surface portions) REP2, and the water repellency of the side surfaces SS1 is higher than the water repellency of the back surface (second main surface) PS2 and the water repellency of the pattern surface (top surface or first main surface) PS1. Consequently, the EUV mask MSK2 also has the same effect as the effect of the EUV mask MSK1 (see FIG. 3) described above. In addition, compared to the EUV mask MSK1 (see FIG. 3), the EUV mask MSK2 has the excellent effect of allowing a productivity improvement or the like without the water repellent treatment of the side surfaces SS1 performed for defective blank products, as described above using FIG. 5.

Also, as shown in FIG. 6, in the peripheral portion of the EUV mask MSK3, the absorber patterns ABS are not formed, while the side surfaces SS1 of the EUV mask MSK3 are formed with the lateral surface portions (side surface portions) REP3. The water repellency of each of the side surfaces SS1 is higher than the water repellency of the back surface (second main surface) PS2 and the water repellency of the pattern surface (top surface or first main surface) PS1. Consequently, the EUV mask MSK3 also has the same effect as the effect of the EUV mask MSK1 (see FIG. 3) described above. In addition, compared to the EUV mask MSK1 (see FIG. 3), the EUV mask MSK3 has the excellent effect of allowing a productivity improvement or the like without the water repellent treatment of the side surfaces SS1 performed for defective blank products, as described above using FIG. 6.

Also, as shown in FIG. 7, the mask base (mask substrate) MS4 of the EUV mask MSK4 is made of a material having inherent water repellency so that the water repellency of the side surface SS1 is higher than the water repellency of the back surface (second main surface) PS2 and the water repellency of the pattern surface (top surface or first main surface) PS1. Consequently, the EUV mask MSK4 also has the same effect as the effect of the EUV mask MSK1 (see FIG. 3) described above. In addition, compared to the case of producing the EUV mask MSK1 (see FIG. 3), the production of the EUV mask MSK4 includes a smaller number of extra steps added to a mask blank production process and a mask production process, and the existing steps and equipment can be used extensively therefor without alterations, as described above using FIG. 7.

Embodiment 2

Next, a description will be given of the manufacturing process of the semiconductor device of Embodiment 2. In Embodiment 1 described above, the description has been given to the manufacturing process of the semiconductor device including the exposure step using the EUV mask. By contrast, in Embodiment 2, the description will be given of an example in which the manufacturing process of the semiconductor device including the exposure step using the EUV mask described in Embodiment 1 is applied to a manufacturing process of a NAND gate circuit.

Figure 22:
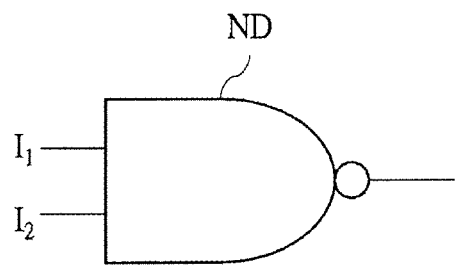
FIG. 22 is a view showing a NAND gate circuit as a semiconductor device of Embodiment 2.
Figure 23:
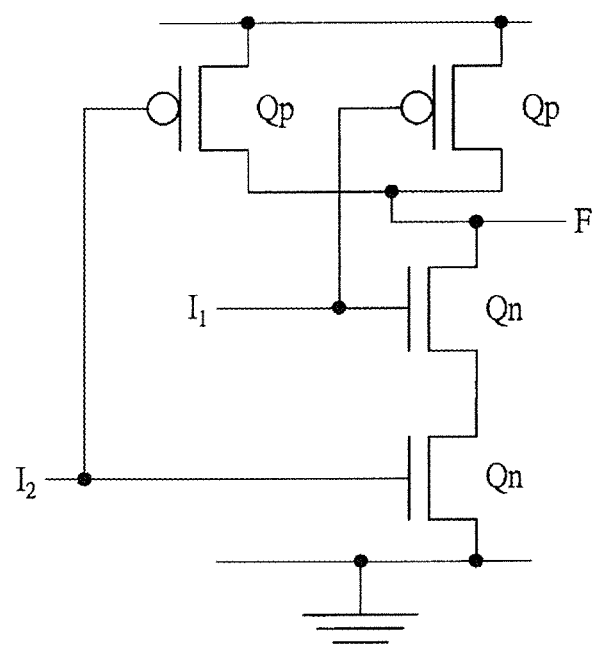
FIG. 23 is a view showing the NAND gate circuit as the semiconductor device of Embodiment 2.

FIGS. 22 and 23 are views showing the NAND gate circuit as the semiconductor device of Embodiment 2. FIG. 22 is a symbol diagram of a 2-input NAND gate circuit ND. FIG. 23 is a circuit diagram of the 2-input NAND gate circuit. The 2-input NAND gate circuit ND as the semiconductor device of Embodiment 2 has two inputs $I_1$ and $I_2$ shown in FIGS. 22 and 23, and an output F as shown in FIG. 23.

Figure 24:
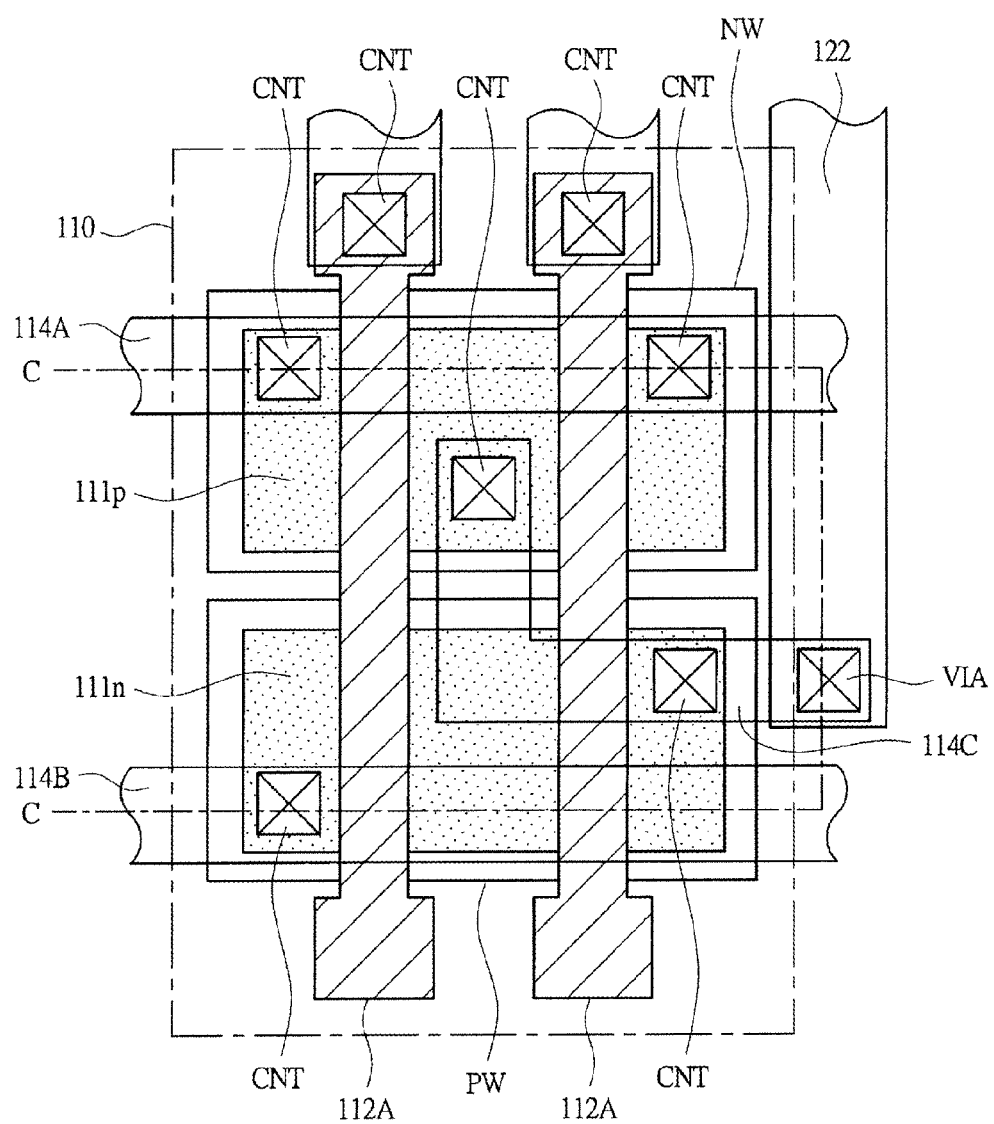
FIG. 24 is a view showing a layout of the NAND gate circuit as the semiconductor device of Embodiment 2.

FIG. 24 is a view showing the layout of the NAND gate circuit as the semiconductor device of Embodiment 2. FIGS. 25 to 30 are plan views for illustrating a mask used in the manufacturing process of the semiconductor device of Embodiment 2.

In FIG. 24, the portion enclosed in the dot-dash line corresponds to a unit cell 110. As will be described later using FIG. 40 or the like, the unit cell 110 has two n-channel MISFETs (Metal Insulator Semiconductor Field Effect Transistors) Qn formed over $n^+$-type diffusion layers 111n in the surface of a p-type well region PW. As will be described later using FIG. 40 or the like, the unit cell 110 also has two p-channel MISFETs Qp formed over $p^+$-type diffusion layers 111p in the surface of an n-type well region NW. Note that the n-channel MISFETs Qn and the p-channel MISFETs Qp are also shown in the circuit diagram of FIG. 23.

To produce the foregoing 2-input NAND gate circuit ND, as shown in FIG. 1, the exposure device 1 including the exposure mechanism unit 1a having the EUV light source 2, the reflection-type illumination optical system 3, the mask stage 4, the reduction projection optical system 5, and the wafer stage 6 is provided. Also, by successively using masks M1 to M6 as respectively shown in FIGS. 25 to 30, pattern transfer to a wafer is repeated. Of the masks M1 to M6, the masks M1 to M3 formed with patterns of relatively large sizes are typical photolithographic masks. On the other hand, the masks M4 to M6 formed with minute patterns of which high size precision is required are EUV lithographic masks (EUV masks).

Figure 25:
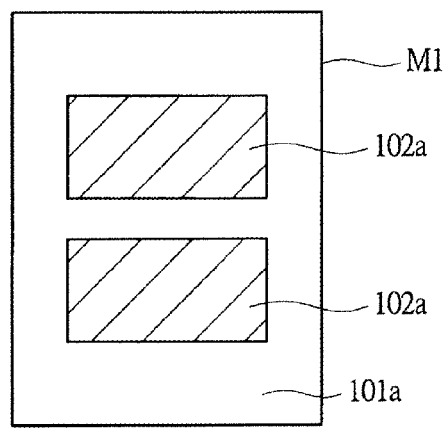
FIG. 25 is a plan view for illustrating a mask used in a manufacturing process of the semiconductor device of Embodiment 2.

In the mask M1 shown in FIG. 25, the reference numeral 101a denotes a transmission region, and the reference numeral 102a denotes each of absorption regions. In the mask M2 shown in FIG. 26, the reference numeral 101b denotes a transmission region, and the reference numeral 102b denotes an absorption region. In the mask M3 shown in FIG. 27, the reference numeral 101c denotes a transmission region, and the reference numeral 102c denotes an absorption region.

Figure 28:
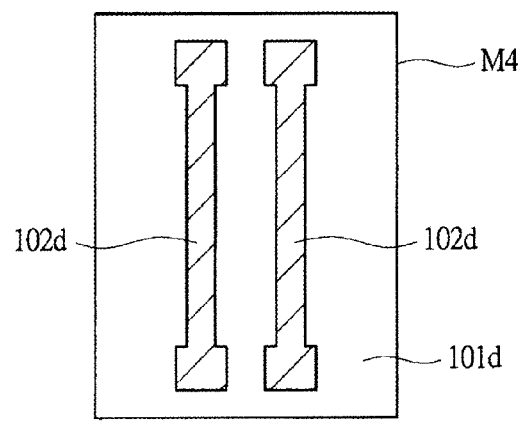
FIG. 28 is a plan view for illustrating the mask used in the manufacturing process of the semiconductor device of Embodiment 2.

In the mask M4 shown in FIG. 28, the reference numeral 101d denotes a reflection region, and the reference numeral 102d denotes each of absorption regions. In the mask M5 shown in FIG. 29, the reference numeral 101e denotes each of reflection regions, and the reference numeral 102e denotes an absorption region. In the mask M6 shown in FIG. 30, the reference numeral 101f denotes each of reflection regions, and the reference numeral 102f denotes an absorption region.

In Embodiment 2, as each of the masks M4, M5, and M6, the EUV mask MSK1 (see FIG. 3) described in Embodiment 1 can be used. At this time, the respective reflection regions 101d, 101e, and 101f of the masks M4, M5, and M6 are each formed of the multilayer reflection film (reflection film) ML described using, e.g., FIG. 3. On the other hand, the respective absorption regions 102d, 102e, and 102f of the masks M4, M5, and M6 are each formed of the absorber patterns ABS described using, e.g., FIG. 3.

Note that, in the same manner as in Embodiment 1, instead of the EUV mask MSK1 (see FIG. 3), the EUV mask MSK2 (see FIG. 5), the EUV mask MSK3 (see FIG. 6), or the EUV mask MSK4 (see FIG. 7) can also be used.

Next, a description will be given of the specific steps of the manufacturing process of the semiconductor device of Embodiment 2. First, referring to FIGS. 31 to 40, the description will be given of the steps prior to and including the step of forming the n-channel MISFETs Qn (see FIG. 40) and the p-channel MISFETs Qp (see FIG. 40). FIGS. 31 to 40 are main-portion cross sectional views of the semiconductor device of Embodiment 2 in the manufacturing process thereof. Note that FIGS. 31 to 40 are cross-sectional views along the line C-C of FIG. 24.

Figure 31:
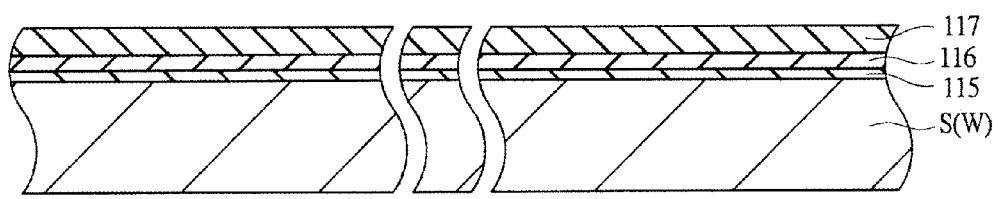
FIG. 31 is a main-portion cross-sectional view of the semiconductor device of Embodiment 2 during the manufacturing process thereof.

First, as shown in FIG. 31, over a wafer W (hereinafter referred to as "semiconductor substrate S" in the following description) made of p-type single-crystal silicon, an insulating film 115 made of, e.g., silicon oxide is formed by an oxidation method. Then, over the insulating film 115, a silicon nitride film 116 is deposited by a CVD (Chemical Vapor Deposition) method. Thereafter, onto the silicon nitride film 116, a resist (photoresist) is applied and subjected to heat treatment to form a resist film (photoresist film) 117.

Figure 32:
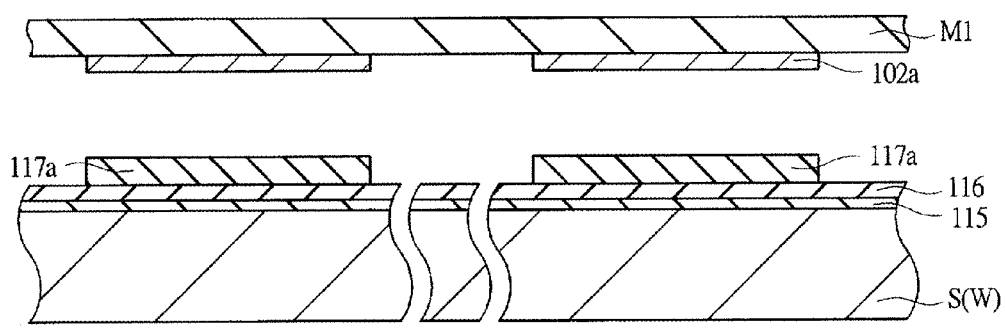
FIG. 32 is a main-portion cross-sectional view of the semiconductor device of Embodiment 2 during the manufacturing process thereof.
Figure 33:
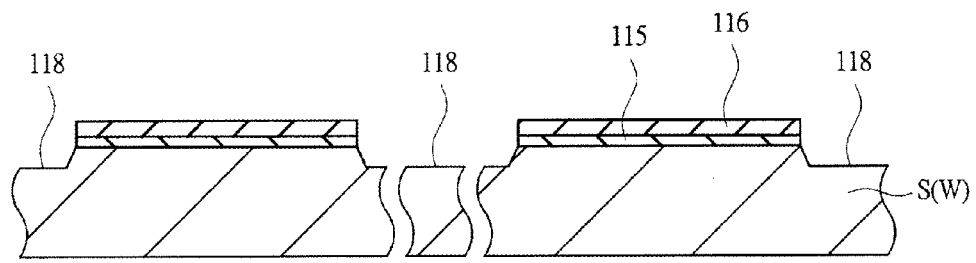
FIG. 33 is a main-portion cross-sectional view of the semiconductor device of Embodiment 2 during the manufacturing process thereof.

Next, as shown in FIG. 32, using the mask M1 formed with the pattern shown in FIG. 25, the resist film (photoresist film) 117 is subjected to exposure treatment and development treatment to form a resist pattern 117a over the silicon nitride film 116. Note that each of the absorption regions 102a is a light blocking film and made of, e.g., Cr.

Next, using the resist pattern 117a (see FIG. 32) as a mask, the silicon nitride film 116 and the insulating film 115 are dry-etched, and then the resist pattern 117a is removed. Subsequently, using the silicon nitride film 116 as a mask, the surface of the semiconductor substrate S is dry-etched to be formed with a trench 118, as shown in FIG. 18.

Figure 34:
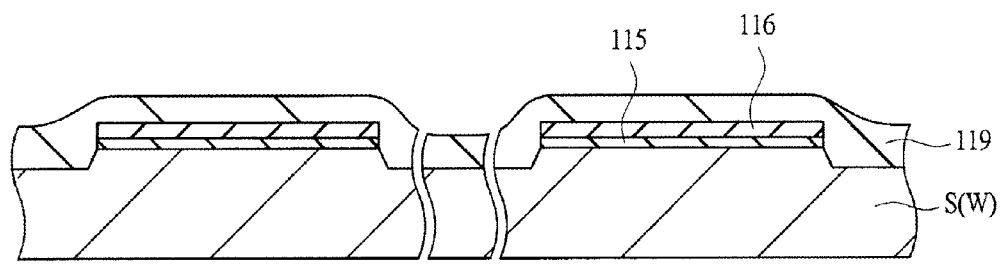
FIG. 34 is a main-portion cross-sectional view of the semiconductor device of Embodiment 2 during the manufacturing process thereof.
Figure 35:
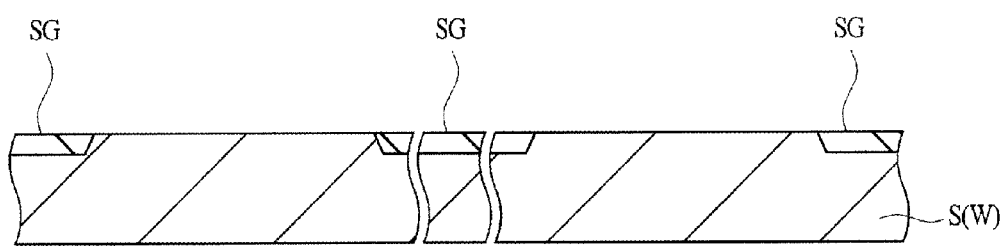
FIG. 35 is a main-portion cross-sectional view of the semiconductor device of Embodiment 2 during the manufacturing process thereof.

Next, as shown in FIG. 34, over the semiconductor substrate S, an insulating film 119 made of, e.g., silicon oxide is deposited by a CVD method. Then, the insulating film 119 is planarized by a chemical mechanical polishing (CMP) method. Subsequently, the silicon nitride film 116 and the insulating film 115 are removed to form an isolation trench SG in the surface of the semiconductor substrate S. Here, isolation is provided by the isolation trench SG, but it is not limited thereto. For example, isolation may also be provided by a field insulating film formed by, e.g., a LOCOS (Local Oxidation of Silicon) method.

Figure 26:
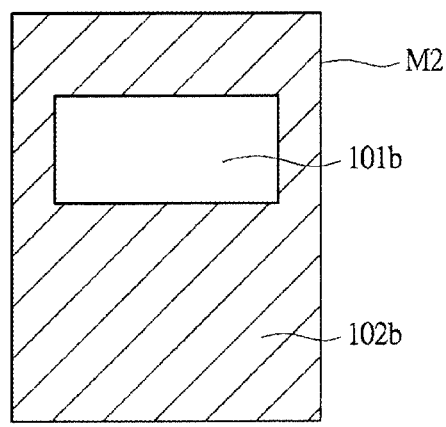
FIG. 26 is a plan view for illustrating the mask used in the manufacturing process of the semiconductor device of Embodiment 2.
Figure 27:
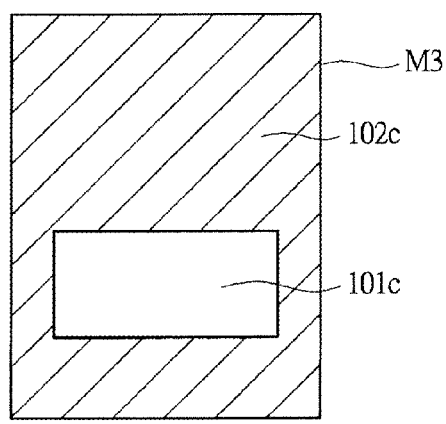
FIG. 27 is a plan view for illustrating the mask used in the manufacturing process of the semiconductor device of Embodiment 2.
Figure 36:
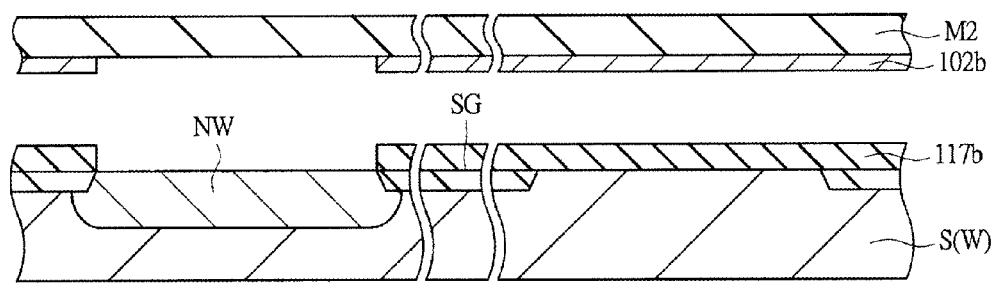
FIG. 36 is a main-portion cross-sectional view of the semiconductor device of Embodiment 2 during the manufacturing process thereof.

Next, as shown in FIG. 36, the resist film (photoresist film) formed over the semiconductor substrate S is subjected to exposure treatment and development treatment using the mask M2 formed with the pattern shown in FIG. 26 to form a resist pattern 117b. Subsequently, into the region of the semiconductor substrate S uncovered with the resist pattern 117b, e.g., phosphorus or arsenic is ion-implanted to form the N-type well region NW. Note that the absorption region 102b is a light blocking film and made of, e.g., Cr.

Figure 37:
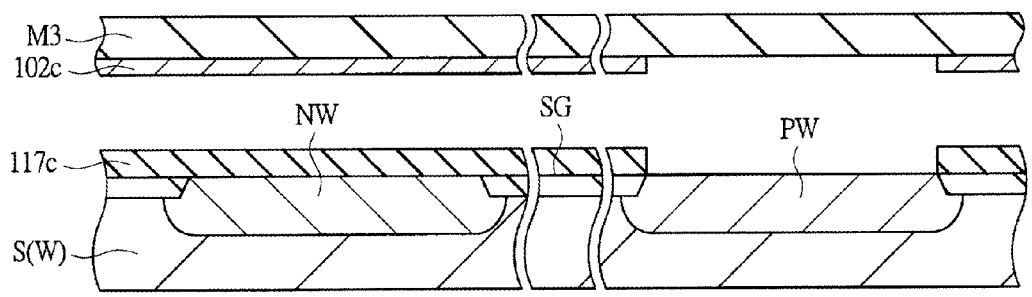
FIG. 37 is a main-portion cross-sectional view of the semiconductor device of Embodiment 2 during the manufacturing process thereof.

Next, the resist pattern 117b is removed. Then, as shown in FIG. 37, the resist film (photoresist film) formed over the semiconductor substrate S is subjected to exposure treatment and development treatment using the mask M3 formed with the pattern shown in FIG. 27 to form a resist pattern 117c. Subsequently, into the region of the semiconductor substrate S uncovered with the resist pattern 117c, e.g., boron is ion-implanted to form the p-type well region PW. Note that the absorption region 102c is a light blocking film and made of, e.g., Cr.

Figure 38:
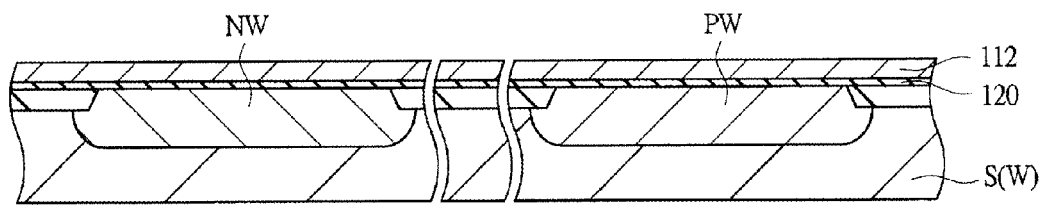
FIG. 38 is a main-portion cross-sectional view of the semiconductor device of Embodiment 2 during the manufacturing process thereof.

Next, as shown in FIG. 38, an insulating film 120 made of, e.g., silicon oxide or the like and having a thickness of about 2 nm is formed over the surface of the semiconductor substrate S. Then, over the insulating film 120, a conductive film 112 formed of, e.g., a laminate film of, e.g., a polysilicon film and a tungsten film is deposited by a CVD method.

Figure 39:
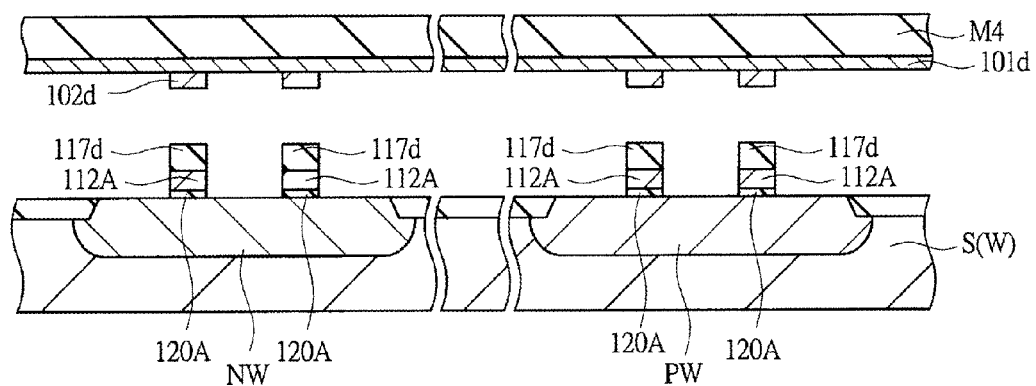
FIG. 39 is a main-portion cross-sectional view of the semiconductor device of Embodiment 2 during the manufacturing process thereof.

Next, the mask M4 formed with the pattern shown in FIG. 28 is provided and, as shown in FIG. 39, the resist film (photoresist film) formed over the conductive film 112 is subjected to exposure treatment and then to development treatment to form a resist pattern 117d. Subsequently, using the resist pattern 117d as a mask, the conductive film 1112 and the insulating film 120 are dry-etched. In this manner, a gate electrode 112A and a gate insulating film 120A which form each of the n-channel MISFETs Qn (see FIG. 40) and the gate electrode 112A and the gate insulating film 120A which form each of the p-channel MISFETs Qp (see FIG. 40) are formed. The reflection region 101d is formed of the multilayer reflection film (reflection film) ML described using, e.g., FIG. 3. On the other hand, each of the absorption regions 102d is formed of the absorber patterns ABS described using, e.g., FIG. 3.

To the steps shown in FIGS. 38 and 38 described above, the manufacturing process of the semiconductor device described using FIGS. 12 to 15 in Embodiment 1 is applicable. That is, as shown in FIG. 12, over the film to be processed (film to be etched) 22 (corresponding to the insulating film 120 and the conductive film 112 of FIG. 38), the resist film (photoresist film) 23 is formed. Then, as shown in FIG. 13, the reflected light 2b which is the exposure light 2a reflected by the pattern surface (top surface or first main surface) PS1 of the EUV mask MSK1 (corresponding to the mask M4 of FIG. 39) is caused to irradiate the resist film (photoresist film) 23 via the reduction projection optical system 5 (see FIG. 1) to subject the resist film (photoresist film) 23 to pattern exposure. Then, as shown in FIG. 14, the resist film (photoresist film) 23 subjected to the pattern exposure is developed to form the resist pattern 23a (corresponding to the resist pattern 117d of FIG. 39) to which the exposure pattern of the EUV mask MSK1 including the absorber patterns ABS has been transferred. Then, using the resist pattern 23a as an etching mask, the film to be processed (film to be etched) 22 is processed (etched). In this manner, as shown in FIG. 15, the pattern 22a (corresponding to the gate electrodes 112A and the gate insulating films 120A of FIG. 39) to which the exposure pattern of the EUV mask MSK1 including the absorber patterns ABS has been transferred is formed.

The side surfaces SS1 of the EUV mask 1 are formed with the lateral surface portions (side surface portions) REP1 having water repellency (see FIG. 3), and the EUV mask MSK1 has been subjected to the mask-back-surface cleaning step (see FIG. 8). Therefore, when the mask-back-surface cleaning step (see FIG. 8) is performed, it is possible to prevent or inhibit foreign materials from adhering to the pattern surface (top surface or first main surface) PS1 and easily remove the foreign materials adhering to the back surface (second main surface) PS2 of the EUV mask MSK1. This allows an improvement in the accuracy of the shapes of the formed gate electrodes 112A and the formed gate insulating films 120A.

Figure 40:
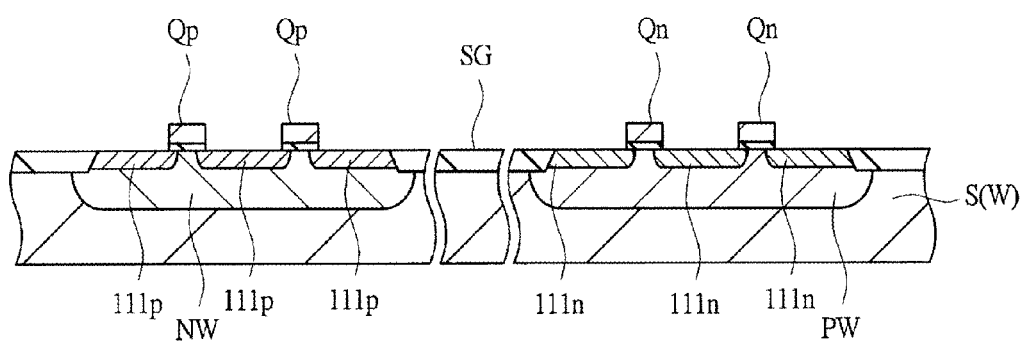
FIG. 40 is a main-portion cross-sectional view of the semiconductor device of Embodiment 2 during the manufacturing process thereof.

Next, after the resist pattern 117d is removed, as shown in FIG. 40, e.g., phosphorus or arsenic is ion-implanted into the p-type well region PW to form the n+-type diffusion layers 111n forming the source and drain of the re-channel MISFETs Qn by self alignment relative to the gate electrodes 112A (see FIG. 39). On the other hand, e.g., boron is ion-implanted into the n-type well region NW to form the p$^+$-type diffusion layers 111p forming the source and drain of the p-channel MISFETs Qp by self alignment relative to the gate electrodes 112A (see FIG. 39). By the steps performed heretofore, the n-channel MISFETs Qn and the p-channel MISFETs Qp are completed.

Next, a description will be given of a wire formation process with reference to FIGS. 41 to 46. FIGS. 41 to 46 are main-portion cross-sectional views of the semiconductor device of Embodiment 2 during the manufacturing process thereof. Note that, similarly to FIGS. 31 to 40, FIGS. 41 to 46 are also cross-sectional views along the line C-C of FIG. 24.

Figure 41:
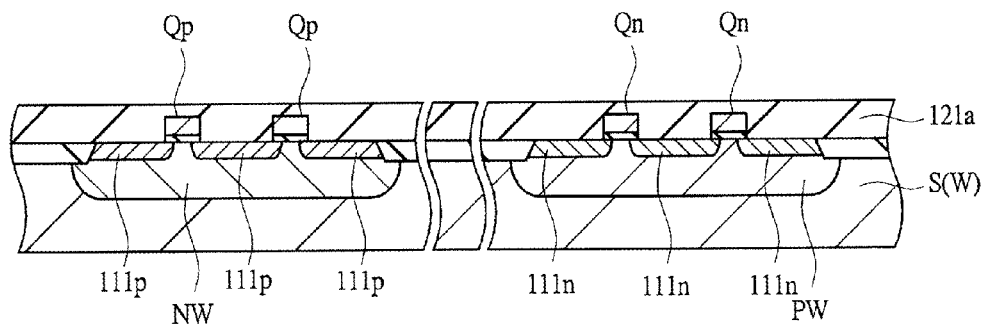
FIG. 41 is a main-portion cross-sectional view of the semiconductor device of Embodiment 2 during the manufacturing process thereof.

First, as shown in FIG. 41, over the n-channels MISFET Qn and the p-channel MISFETs Qp, an interlayer insulating film 121a made of, e.g., silicon oxide or the like is deposited by a CVD method.

Figure 29:
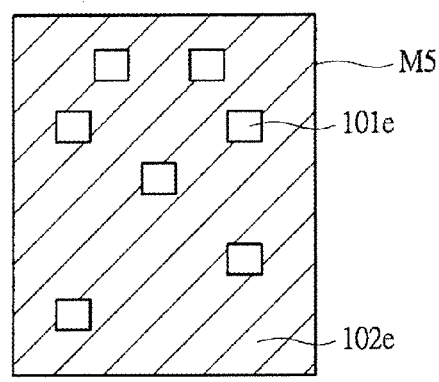
FIG. 29 is a plan view for illustrating the mask used in the manufacturing process of the semiconductor device of Embodiment 2.
Figure 42:
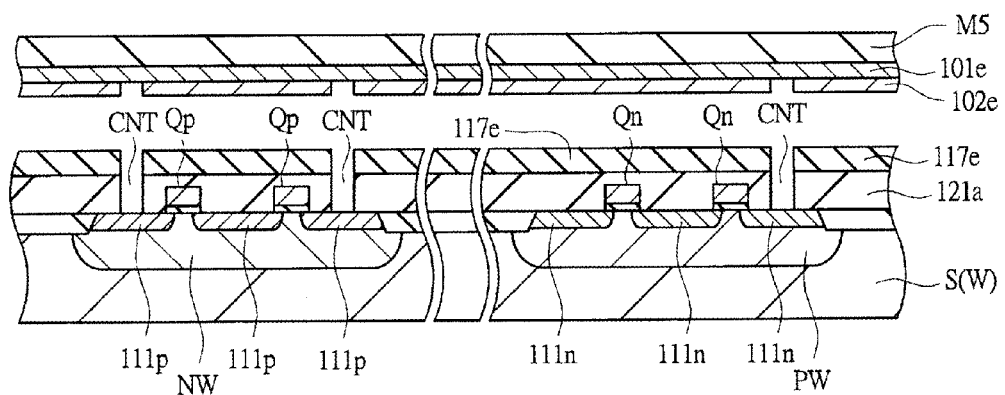
FIG. 42 is a main-portion cross-sectional view of the semiconductor device of Embodiment 2 during the manufacturing process thereof.

Next, the mask M5 formed with the pattern shown in FIG. 29 is provided and, as shown in FIG. 42, the resist film (photoresist film) formed over the interlayer insulating film 121a is subjected to exposure treatment and then to development treatment to form a resist pattern 117e. Subsequently, using the resist pattern 117e as a mask, the interlayer insulating film 121a is dry-etched to form the interlayer insulating film 121a with contact holes CNT over the n$^+$-type diffusion layers 111n and the p$^+$-type diffusion layers 111p. Each of the reflection regions 101e is formed of the multilayer reflection film (reflection film) ML described using, e.g., FIG. 3. On the other hand, the absorption region 102e is formed of the absorber patterns ABS described using, e.g., FIG. 3.

To the step shown in FIG. 42 described above also, in the same manner as to the step shown in FIG. 39, the manufacturing process of the semiconductor device described in Embodiment 1 using FIGS. 12 to 15 is applicable. In addition, the side surfaces SS1 of the EUV mask MSK1 are formed with the lateral surface portions (side surface portions) REP1 having water repellency (see FIG. 3), and the EUV mask MSK1 has been subjected to the mask-back-surface cleaning step (see FIG. 8). Therefore, when the mask-back-surface cleaning step (see FIG. 8) is performed, it is possible to prevent or inhibit foreign materials from adhering to the pattern surface (top surface or first main surface) PS1 and easily remove the foreign materials adhering to the back surface (second main surface) PS2 of the EUV mask MSK1. This allows an improvement in the accuracy of the shapes of the formed contact holes CNT.

Figure 43:
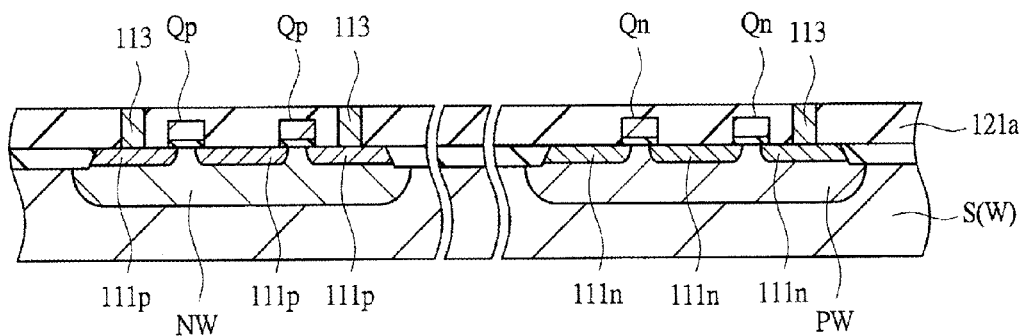
FIG. 43 is a main-portion cross-sectional view of the semiconductor device of Embodiment 2 during the manufacturing process thereof.

Next, after the resist pattern 117e is removed, as shown in FIG. 43, a metal film made of, e.g., tungsten (W), a tungsten alloy, copper (Cu), or the like is embedded in the contact holes CNT. Subsequently, the surface of the metal film is planarized by a CMP method. In this manner, metal plugs 113 are formed in the contact holes CNT.

Figure 30:
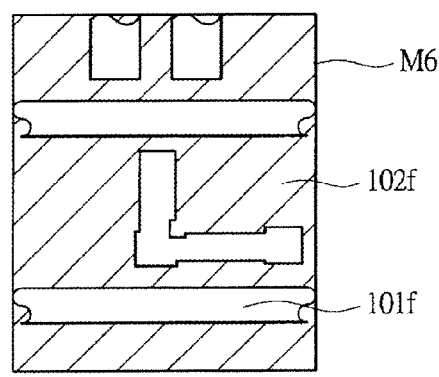
FIG. 30 is a plan view for illustrating the mask used in the manufacturing process of the semiconductor device of Embodiment 2.
Figure 44:
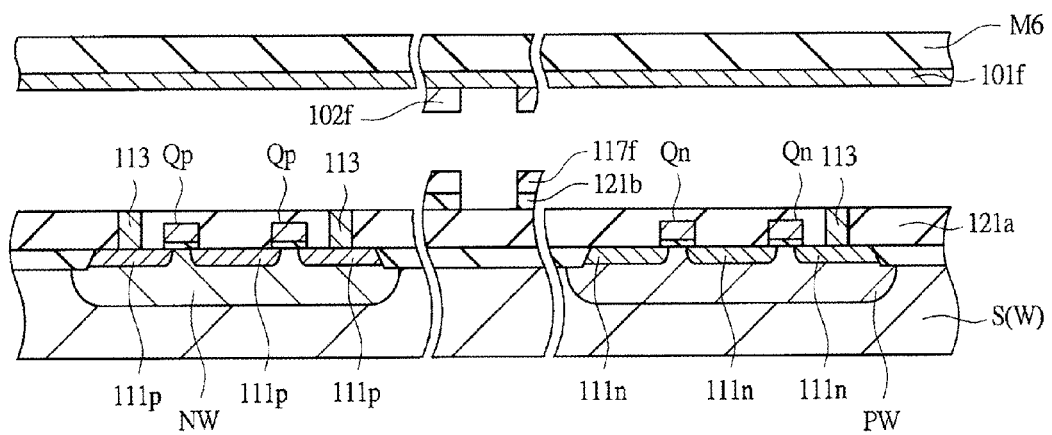
FIG. 44 is a main-portion cross-sectional view of the semiconductor device of Embodiment 2 during the manufacturing process thereof.

Next, as shown in FIG. 44, over the interlayer insulating film 121a, an interlayer insulating film 121b made of, e.g., silicon oxide or the like is deposited by a CVD method. Subsequently, the mask M6 formed with the pattern shown in FIG. 30 is provided. The resist film (photoresist film) formed over the interlayer insulating film 121b is subjected to exposure treatment and then to development treatment to form a resist pattern 117f. Subsequently, using the resist pattern 117f as a mask, the interlayer insulating film 121b is dry-etched. Each of the reflection regions 101f is formed of the multilayer reflection film (reflection film) ML described using, e.g., FIG. 3. On the other hand, the absorption region 102f is formed of the absorber patterns ABS described using, e.g., FIG. 3.

To the step shown in FIG. 44 described above also, in the same manner as to the step shown in FIG. 42, the manufacturing process of the semiconductor device described in Embodiment 1 using FIGS. 12 to 15 is applicable. In addition, the side surfaces SS1 of the EUV mask MSK1 are formed with the lateral surface portions (side surface portions) REP1 having water repellency (see FIG. 3), and the EUV mask MSK1 has been subjected to the mask-back-surface cleaning step (see FIG. 8). Therefore, when the mask-back-surface cleaning step (see FIG. 8) is performed, it is possible to prevent or inhibit foreign materials from adhering to the pattern surface (top surface or first main surface) PS1 and easily remove the foreign materials adhering to the back surface (second main surface) PS2 of the EUV mask MSK1. This allows an improvement in the accuracy of the shape of the pattern formed by dry-etching the interlayer insulating film 121b.

Figure 45:
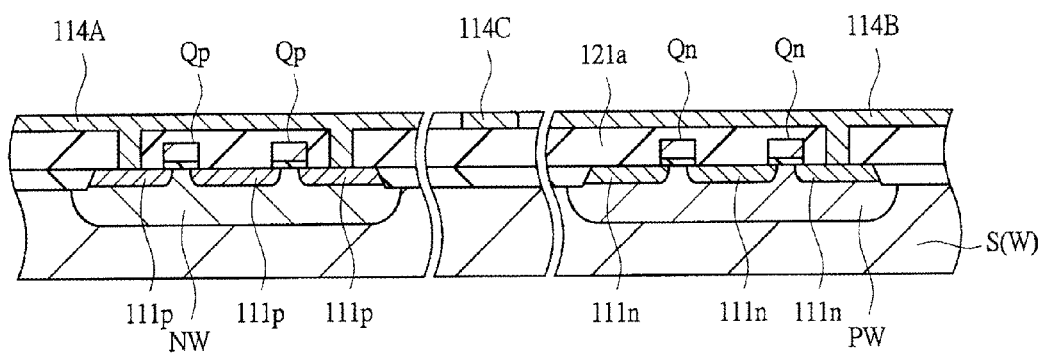
FIG. 45 is a main-portion cross-sectional view of the semiconductor device of Embodiment 2 during the manufacturing process thereof.

Next, after the resist pattern 117f is removed, as shown in FIG. 45, a metal film made of, e.g., copper or the like is deposited by a sputtering method. Subsequently, the surface of the metal film is planarized by a CMP method to form wires 114A, 114B, and 114C.

Figure 46:
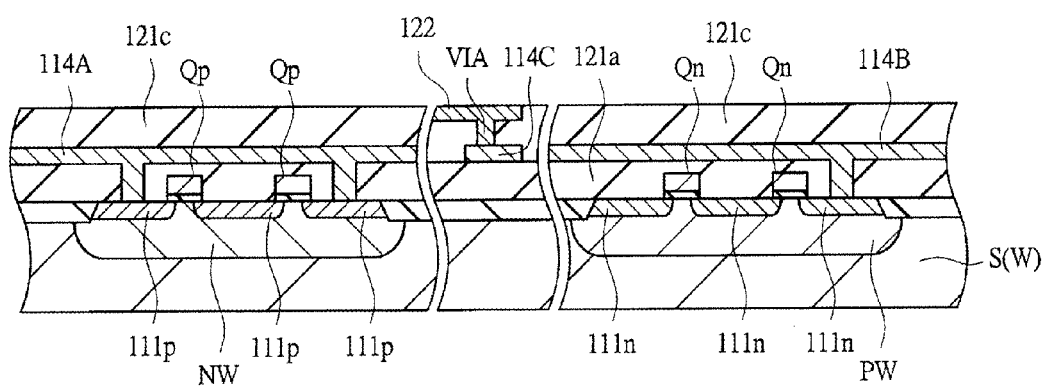
FIG. 46 is a main-portion cross-sectional view of the semiconductor device of Embodiment 2 during the manufacturing process thereof.

Next, as shown in FIG. 46, over the wires 114A, 114B, and 114C, an interlayer insulating film 121c made of, e.g., silicon oxide or the like is deposited by a CVD method. Then, using another EUV mask other than the EUV mask described using FIGS. 25 to 30, the interlayer insulating film 121c over the wire 114C is formed with a through hole VIA. Then, a second-layer wire 122 coupled to the wire 114C through the through hole VIA is formed to complete the 2-input NAND gate. Note that, by changing the shapes and positions of the aperture patterns formed in the masks M5 and M6, another circuit such as a NOR gate circuit can also be formed.

Embodiment 3

Next, a description will be given of the manufacturing process of the semiconductor device of Embodiment 3. In Embodiment 1 described above, the description has been given of the manufacturing process of the semiconductor device including the exposure step using the EUV mask. By contrast, in Embodiment 3, the description will be given of an example in which the manufacturing process of the semiconductor device including the exposure step using the EUV mask described in Embodiment 1 is applied to the manufacturing process of multiple items and multiple lots of semiconductor integrated circuit devices.

Figure 47:
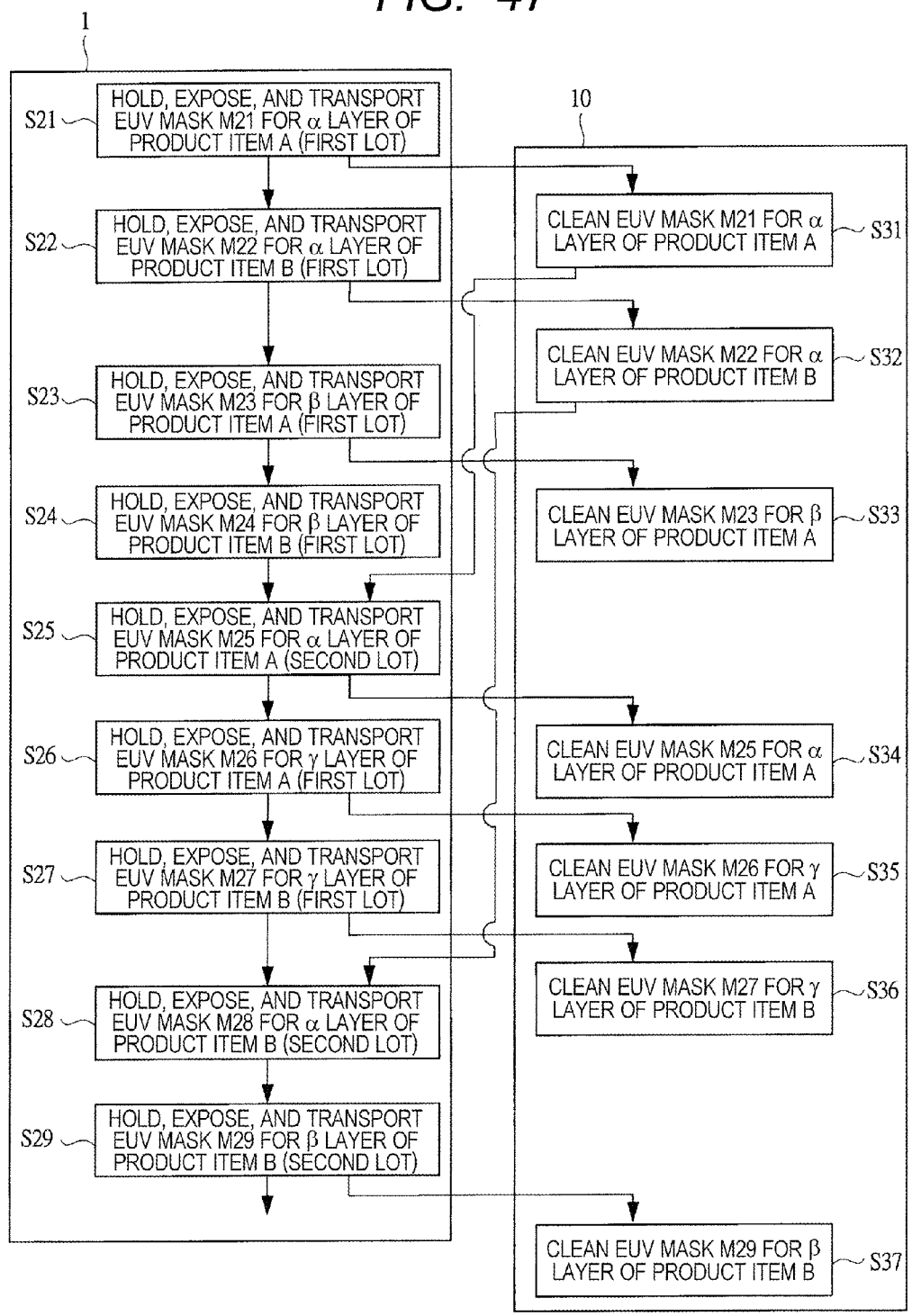
FIG. 47 is a flow chart showing a part of a manufacturing process of a semiconductor device of Embodiment 3.

FIG. 47 is a flow chart showing a part of the manufacturing process of the semiconductor device of Embodiment 3.

First, in the exposure device 1 (see FIG. 1), an EUV mask M21 for the α layer of the first lot of a product item A is held on the mask stage 4 (see FIG. 1) and, using the held EUV mask M21, a plurality of wafers in the first lot of the product item A are subjected to exposure. After the exposure is ended, the EUV mask M21 is transported from the mask stage 4 and stored in a mask stocker (Step S21).

As the specific step of Step S21, the step described as Steps S13 to S15 of FIG. 11 in Embodiment 1 is performed using the EUV mask M21 having the side surfaces SS1 each having water repellency, in the same manner as for the EUV mask MSK1. That is, the EUV mask M21 stored in the mask stocker (the illustration thereof is omitted) is transported, and the back surface (second main surface) PS2 of the transported EUV mask M21 is sucked to the lower surface (surface) 4b of the electrostatic chuck 4a (see FIG. 1) to be held on the mask stage 4 (Step S13 of FIG. 11). Then, with the EUV mask M21 being held on the mask stage 4, the wafer 21 is held on the wafer stage 6, and the held wafer 21 is subjected to pattern exposure using the EUV mask M21 (Step S14 of FIG. 11). Then, the EUV mask M21 is transported from the mask stage 4 (Step S15 of FIG. 11).

Then, in the exposure device 1, in the same manner as in the step of Step S21, an EUV mask M22 for the α layer of the first lot of a product item B is held on the mask stage 4 and, using the held EUV mask M22, a plurality of wafers in the first lot of the product item B are subjected to exposure. Then, after the exposure is ended, the EUV mask M22 is transported from the mask stage 4 and stored in the mask stocker (Step S22).

On the other hand, in the cleaning device 10 (see FIG. 8), the EUV mask M21 for the α layer of the product item A used in the step of Step S21 is subjected to the mask-back-surface cleaning step (Step S31). Specifically, in the cleaning device 10 described using FIG. 8 in Embodiment 1, the EUV mask M21 is held on the spinner 11 using the mask pressing pins 12 such that the pattern surface (top surface or first main surface) PS1 faces downward and the back surface (second main surface) PS2 faces upward. Then, while the EUV mask M21 is rotated on the spinner 11, the cleaning liquid (rinse liquid) 17 made of, e.g., water (pure water) or the like is supplied to the back surface (second main surface) PS2 of the EUV mask M21 to remove the foreign materials adhering to the back surface (second main surface) PS2, preferably using the brush 16 in combination.

Also, in the cleaning device 10, the EUV mask M22 for the α layer of the product item B used in the step of Step S22 is subjected to the mask-back-surface cleaning step in the same manner as in the step of Step S31 (Step S32).

On the other hand, in the exposure device 1, after the step of Step S22, in the same manner as in the step of Step S22, an EUV mask M23 for the β layer of the first lot of the product item A is held on the mask stage 4 and, using the held EUV mask M23, a plurality of wafers in the first lot of the product item A are subjected to exposure. Then, after the exposure is ended, the EUV mask M23 is transported from the mask stage 4 and stored in the mask stocker (Step S23).

Then, in the exposure device 1, in the same manner as in the step of Step S23, an EUV mask M24 for the β layer of the first lot of the product item B is held on the mask stage 4 and, using the held EUV mask M24, the plurality of wafers in the first lot of the product item B are subjected to exposure. Then, after the exposure is ended, the EUV mask M24 is transported from the mask stage 4 and stored in the mask stocker (Step S24).

On the other hand, in the cleaning device 10, after the step of Step S32, in the same manner as in the step of Step S32, the EUV mask M23 for the β layer of the product item A used in the step of Step S23 is subjected to the mask-back-surface cleaning step (Step S33)

Here, after transported from the mask stage 4, the EUV mask used for exposure in the exposure device 1 may also be subjected to a foreign material inspection for the back surface (second main surface) PS2 thereof and subjected to the mask-back-surface cleaning step only when the value detected in the foreign material inspection is not within a tolerable range. FIG. 47 shows an example in which, after the step of Step S24, the EUV mask M24 for the β layer of the first lot of the product item B used in the step of Step S24 is subjected to the foreign material inspection for the back surface (second main surface) PS2 thereof and, since the value detected in the foreign material inspection is within the tolerable range, the EUV mask M24 is not subjected to the back-surface cleaning.

Next, in the exposure device 1, in the same manner as in the step of Step S24, an EUV mask M25 for the α layer of the second lot of the product item A is held on the mask stage 4 and, using the held EUV mask M25, a plurality of wafers in the second lot of the product item A are subjected to exposure. After the exposure is ended, the EUV mask M25 is transported from the mask stage 4 and stored in the mask stock (Step S25). In Step S25, as the EUV mask M25, the EUV mask M21 subjected to the mask-back-surface cleaning step of Step S31 is used. Then, in the cleaning device 10, the EUV mask M25 for the α layer of the product item A is subjected to the mask-back-surface cleaning step in the same manner as in the step of Step S33.

Next, in the exposure device 1, in the same manner as in the step of Step S25, an EUV mask M26 for the γ layer of the first lot of the product item A is held on the mask stage 4 and, using the held EUV mask M26, the plurality of wafers of the first lot of the product item A are subjected to exposure. Then, after the exposure is ended, the EUV mask M26 is transported from the mask stage 4 and stored in the mask stocker (Step S26).

Then, in the exposure device 1, the same step as the step of Step S26 is performed by using an EUV mask M27 for the γ layer of the first lot of the product item B (Step S27), an EUV mask M28 for the α layer of the second lot of the product item B (Step S28), and an EUV mask M29 for the β layer of the second lot of the product item B (Step S29) in succession. At this time, in Step S28, as the EUV mask M28, the EUV mask M22 subjected to the mask-back-surface cleaning step of Step S32 is used.

On the other hand, in the cleaning device 10, the same step as the step of Step S34 is performed for the EUV mask M26 for the γ layer of the product item A (Step S35), the EUV mask M27 for the γ layer of the product item B (Step S36), and the EUV mask M29 for the β layer of the product item B (Step S37) in succession. FIG. 47 shows an example in which, after the step of Step S27, the EUV mask M28 (identical to the EUV mask M22) for the α layer of the product item B used in the step of Step S28 is removed from the mask stage 4 and then subjected to the foreign material inspection for the back surface (second main surface) PS2 and, since the value detected in the foreign material inspection is within the tolerable range, the EUV mask M28 is not subjected to the mask-back-surface cleaning step.

To allow, e.g., the EUV mask M21 subjected to the mask-back-surface cleaning step of Step S31 to be used as the EUV mask M25 in the step of Step S25, the EUV mask subjected to the mask-back-surface cleaning step using the cleaning device 10 is used again for exposure in the exposure device 1. Also, as the EUV masks M21 to M29 used in Embodiment 3, the EUV masks MSK1 (see FIG. 3), the EUV mask MSK2 (see FIG. 5), the EUV mask MSK3 (see FIG. 6), or the EUV mask MSK4 (see FIG. 7) described in Embodiment 1 can be used. Therefore, by performing the mask-back-surface cleaning step (e.g., Step S31) during each interval between EUV exposure steps (e.g., between Steps S21 and S25) for the same kind of layers of the same product item which have different lot numbers, it is possible to prevent or inhibit the occurrence of the OPD or IPD and prevent or inhibit the occurrence of displacement in the transferred pattern. As a result, it is possible to increase the production yield of the manufactured semiconductor device and consequently improve the performance of the semiconductor device.

Also, by performing the mask-back-surface cleaning step (e.g., Step S31), the foreign materials adhering to the back surface PS2 of the EUV mask can be removed generally completely. Accordingly, even when the operation of holding the EUV mask on the mask stage 4 (see FIG. 1) and the operation of transporting the EUV mask from the mask stage 4 are repeated, the number of the foreign materials cumulatively adhering to the back surface (second main surface) PS2 of the EUV mask decreases. Consequently, as described using the illustration of the EUV mask M24 for the β layer of the product item B used in the step of Step S24 in FIG. 47, after transported from the mask stage 4, the EUV mask M24 need not necessarily be subjected to the mask-back-surface cleaning step. Therefore, it is possible to improve the productivity of the manufactured semiconductor device and reduce the manufacturing cost thereof, while ensuring the production yield thereof.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

For example, in each of Embodiments 1, 2, and 3, the description has been given to the example in which the mask having water repellency at the side surfaces thereof is applied to the EUV mask for performing the EUV lithographic step. However, the mask having water repellency at the side surfaces thereof is not limited to the example applied to the EUV mask, but is also applicable to, e.g., a reflection-type mask for performing a photolithographic step other than the EUV lithographic step or another photomask which is held with the back surface thereof being in contact with the top surface of the mask stage.

In each of Embodiments 1, 2, and 3, the description has been given to the example in which the mask having water repellency at the side surfaces thereof is applied to the mask having the conductive film formed over the back surface thereof which is held on the mask stage through electrostatic suction of the conductive film by the electrostatic chuck of the mask stage. However, the mask having the water repellency at the side surfaces thereof is not limited to the example in which the mask having the water repellency at the side surfaces thereof is applied to the mask held through the electrostatic suction. For example, the mask having the water repellency at the side surfaces thereof is also applicable to a reflection-type mask or another photomask which does not have a conductive film formed over the back surface thereof and is held on a mask stage with the back surface thereof being in contact with the mask stage.

What is claimed is:

1. A method of manufacturing a semiconductor device, comprising the steps of:
    (a) providing a mask having a top surface, a cleaned back surface opposite to the top surface, a side surface disposed between the top surface and the back surface, and an exposure pattern formed over the top surface, wherein a water repellency of the side surface of the mask is higher than a water repellency of the top surface of the mask, the back surface being cleaned by supplying a cleaning liquid to the back surface of the mask, the water repellency of the side surface repelling the cleaning liquid supplied to the back surface;
    (b) holding the mask using a holder for holding the mask with the back surface being in contact with the holder;
    (c) forming a resist film over a film to be etched formed over a main surface of a substrate;
    (d) irradiating the top surface of the mask held on the holder with exposure light to subject the resist film to pattern exposure using reflected light which is the exposure light used for the irradiation and reflected by the top surface;
    (e) developing the resist film subjected to the pattern exposure to form a resist pattern to which the exposure pattern has been transferred; and
    (f) using the resist pattern as an etching mask to etch the film to be etched.

2. The method of manufacturing a semiconductor device according to claim 1,
    wherein, in the step (a), the mask is provided which has the top surface, the cleaned back surface, the side surface, the exposure pattern, and a cleaned conductive film formed over the back surface, and
    wherein, in the step (b), the holder being in contact with the back surface electrostatically sucks the conductive film to hold the mask.

3. The method of manufacturing a semiconductor device according to claim 1,
    wherein, in the step (a), the mask is provided which has the top surface, the cleaned back surface, the side surface, a reflection film formed over the top surface to reflect the exposure light, the exposure pattern including an absorber pattern formed over the reflection film to absorb the exposure light, and a side surface portion formed over the side surface, and
    wherein a water repellency of the side surface portion is higher than the water repellency of the top surface.

4. The method of manufacturing a semiconductor device according to claim 1,
    wherein, in the step (a), the mask having the cleaned back surface is provided by rotating the mask having the top surface, the back surface, the side surface, and the exposure pattern with the back surface facing upward and cleaning the back surface with a brush, while supplying the cleaning liquid to the back surface.

5. The method of manufacturing a semiconductor device according to claim 1,
    wherein a contact angle between the side surface and water is not less than 70 degrees.

6. The method of manufacturing a semiconductor device according to claim 1,
    wherein the side surface is fluorinated.

7. The method of manufacturing a semiconductor device according to claim 1,
    wherein the exposure light is extreme ultraviolet light.

8. A mask for performing pattern exposure using reflected light which is exposure light irradiating a top surface of the mask and reflected by the top surface, the mask comprising:
    the top surface;
    a back surface opposite to the top surface;
    a side surface disposed between the top surface and the back surface; and
    an exposure pattern formed over the top surface,
    wherein a water repellency of the side surface is higher than a water repellency of the top surface.

9. The mask according to claim 8, further comprising:
    a conductive film formed over the back surface,
    wherein a holder for holding the mask electrostatically sucks the conductive film while being in contact with the back surface to hold the mask.

10. The mask according to claim 8, further comprising:
    a side surface portion formed over the side surface,
    wherein the exposure pattern includes a reflection film formed over the top surface to reflect the exposure light, and an absorber pattern formed over the reflection film to absorb the exposure light, and wherein a water repellency of the side surface portion is higher than the water repellency of the top surface.

11. The mask according to claim 8,
wherein a contact angle between the side surface and water is not less than 70 degrees.

12. The mask according to claim 8,
wherein the side surface is fluorinated.

13. The mask according to claim 8,
wherein the exposure light is extreme ultraviolet light.

14. A method of manufacturing a semiconductor device, comprising the steps of:

providing a mask having a top surface, a back surface opposite to the top surface, a side surface disposed between the top surface and the back surface, a side surface portion formed over the side surface, an exposure pattern formed over the top surface, the exposure pattern including a reflection film formed over the top surface to reflect the exposure light, and an absorber pattern formed over the reflection film to absorb the exposure light and a conductive film formed over the back surface, wherein a water repellency of the side surface of the mask and the side surface portion is higher than a water repellency of the top surface of the mask;

cleaning the back surface of the mask;

holding the mask using a holder for holding the mask with the back surface being in contact with the holder, using the holder for holding the mask to electrostatically suck the conductive film while being in contact with the back surface to hold the mask;

forming a resist film over a film to be etched formed over a main surface of a substrate;

irradiating the top surface of the mask held on the holder with exposure light to subject the resist film to pattern exposure using reflected light which is the exposure light used for the irradiation and reflected by the top surface, the mask being held with the cleaned back surface being in contact with the holder;

developing the resist film subjected to the pattern exposure to form a resist pattern to which the exposure pattern has been transferred; and using the resist pattern as an etching mask to etch the film to be etched.

15. The method according to claim 14,
wherein the water repellency, as defined by a contact angle between the side surface and water, is not less than 70 degrees.

16. The method according to claim 14,
wherein the side surface is fluorinated.

17. The method according to claim 14,
wherein, in the irradiating step, the exposure light is extreme ultraviolet light.

* * * * *